US008223315B2

(12) United States Patent
 Ohsaki

(10) Patent No.: US 8,223,315 B2
(45) Date of Patent: Jul. 17, 2012

(54) MEASURING APPARATUS AND EXPOSURE APPARATUS HAVING THE SAME

(75) Inventor: Yumiko Ohsaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 358 days.

(21) Appl. No.: 12/434,095

(22) Filed: May 1, 2009

(65) Prior Publication Data

US 2009/0274964 A1 Nov. 5, 2009

Related U.S. Application Data

(62) Division of application No. 11/276,164, filed on Feb. 16, 2006, now Pat. No. 7,538,854.

(30) Foreign Application Priority Data

Feb. 17, 2005 (JP) ................................. 2005-040271

(51) Int. Cl.
 *G03B 27/52* (2006.01)
 *G03B 27/72* (2006.01)
(52) U.S. Cl. .......................................... 355/55; 355/71
(58) Field of Classification Search .................... 355/55, 355/53, 74; 356/399, 400, 401, 515
 See application file for complete search history.

(56) References Cited

U.S. PATENT DOCUMENTS

| 5,838,453 | A | 11/1998 | Ohsaki et al. |
|---|---|---|---|
| 5,903,352 | A | 5/1999 | Ohsaki et al. |
| 5,903,356 | A | 5/1999 | Shiraishi |
| 6,088,115 | A | 7/2000 | Ohsaki et al. |
| 6,312,373 | B1 | 11/2001 | Ichihara |
| 2005/0078287 | A1 | 4/2005 | Sengers et al. |
| 2005/0117171 | A1 | 6/2005 | Kato |

FOREIGN PATENT DOCUMENTS

| JP | 57-064139 | 4/1982 |
|---|---|---|
| JP | 2000-97666 | 4/2000 |
| JP | 2000-146705 | 5/2000 |
| JP | 2005-156506 | 6/2006 |

*Primary Examiner* — Peter B Kim
(74) *Attorney, Agent, or Firm* — Fitzpatrick, Cella, Harper & Scinto

(57) ABSTRACT

A measuring apparatus for measuring an optical performance of an optical system under test that has a numerical aperture of more than 0.6 at a light exit side, said measuring apparatus includes a numerical aperture decreasing part for decreasing the numerical aperture of a light exited from the optical system under test to 0.6 or less, and a detector for detecting an interference fringes formed by the light that passes through the numerical aperture decreasing part.

4 Claims, 25 Drawing Sheets ent according to the present invention.

MEASURING APPARATUS AND EXPOSURE APPARATUS HAVING THE SAME

This is a divisional of co-pending U.S. patent application Ser. No. 11/276,164, filed Feb. 16, 2006.

BACKGROUND OF THE INVENTION

The present invention relates generally to a measurement for an optical performance of an optical system under test and more particularly to a measuring apparatus that measures a wave front aberration of a projection optical system that transfers a pattern of a reticle onto an object, and an exposure apparatus having the same.

A projection exposure apparatus is used to transfer a pattern on a reticle (or a mask) onto an object to be exposed in manufacturing devices, such as semiconductor devices, e.g., an IC and a LSI, image pick-up devices, such as a CCD, display devices, such as a liquid crystal panel, and magnetic heads, in the photolithography process. This exposure apparatus is required to transfer the pattern on the reticle onto the object precisely at a predetermined magnification. For this purpose, it is important to use a projection optical system having good imaging performance and reduced aberration. In particular, due to the recent demands for finer processing to the semiconductor device, a transferred pattern is more sensitive to the aberration of the optical system. Therefore, there is a demand to measure the optical performance, such as a wave front aberration, of the projection optical system with high precision.

A conventional method that actually exposes a reticle pattern onto a wafer, and observes and inspects the resist image using a scanning electron microscope ("SEM") or another means has a problem in a long time inspection due to the exposure and development, difficult SEM operations, and bad inspection reproducibility due to errors caused by resist applications and developments. Accordingly, as a solution for these problems, various measuring apparatuses have conventionally been proposed, such as a point diffraction interferometer ("PDI") that has a pinhole used to form an ideal spherical wave, a shearing interferometer, such as a lateral shearing interferometer ("LSI"), or a Talbo interferometer that utilizes the shearing interferometer, and a line diffraction interferometer ("LDI") that has a slit used to form an ideal cylindrical wave or an ideal elliptical wave. See, for example, Japanese Patent Applications, Publication Nos. 57-64139, 2000-146705, and 2000-97666.

Nevertheless, the conventional entire system that includes the measuring apparatus and exposure apparatus separately is large and structurally complex, causing the increased cost and the long measuring time. Accordingly, applicant has already proposed an exposure apparatus equipped with an interferometer in Japanese Patent Application, Publication No. 2005-156506.

However, a curved of the interference fringes and a pitch difference increase according to the demands for finer processing to the circuit pattern and higher a numerical aperture ("NA") of the projection optical system, and a shearing ratio (an amount corresponding to a shift amount between a $0^{th}$ order light and $\pm 1^{st}$ order light) particularly changes according to positions. Then, the inventor discovered that the above interferometer cannot maintain the high precision measurement, if the NA of the projection optical system becomes a predetermined value or more.

BRIEF SUMMARY OF THE INVENTION

Accordingly, the present invention is directed to a measuring apparatus that can measure a wave front with high precision even if a NA of a projection optical system becomes higher, and an exposure apparatus having the same.

A measuring apparatus according to one aspect of the present invention for measuring an optical performance of an optical system under test that has a numerical aperture of more than 0.6 at a light exit side, said measuring apparatus includes a numerical aperture decreasing part for decreasing the numerical aperture of a light exited from the optical system under test to 0.6 or less, and a detector for detecting an interference fringes formed by the light that passes through the numerical aperture decreasing part.

A measuring apparatus according to another aspect of the present invention for measuring an optical performance of an optical system under test that has a numerical aperture of more than 0.6 at a light exit side, said measuring apparatus includes a substrate for interference measurement that is used for the numerical aperture of 0.6 or less of a light exited from the optical system under test, and includes a first pattern that has a first pitch, and a second pattern that has a second pitch, the second pitch corresponding to the numerical aperture of more than 0.6 of the light exited from the optical system under test and being narrower than the first pitch, and a detector for detecting an interference fringes formed by the light, wherein said measuring apparatus combines results of plural measurements, using the first pattern and the second pattern.

An exposure apparatus according to another aspect of the present invention for exposing a pattern of a reticle onto an object via a projection optical system using a light from the light source, said exposure apparatus comprising a measuring apparatus for detecting an optical performance of the projection optical system using the light as an interference fringes, wherein said projection optical system has a numerical aperture of more than 0.6 at an object side, and wherein said measuring apparatus is the above measuring apparatus.

A device fabrication method according to another aspect of the present invention includes the steps of exposing an object using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 22:
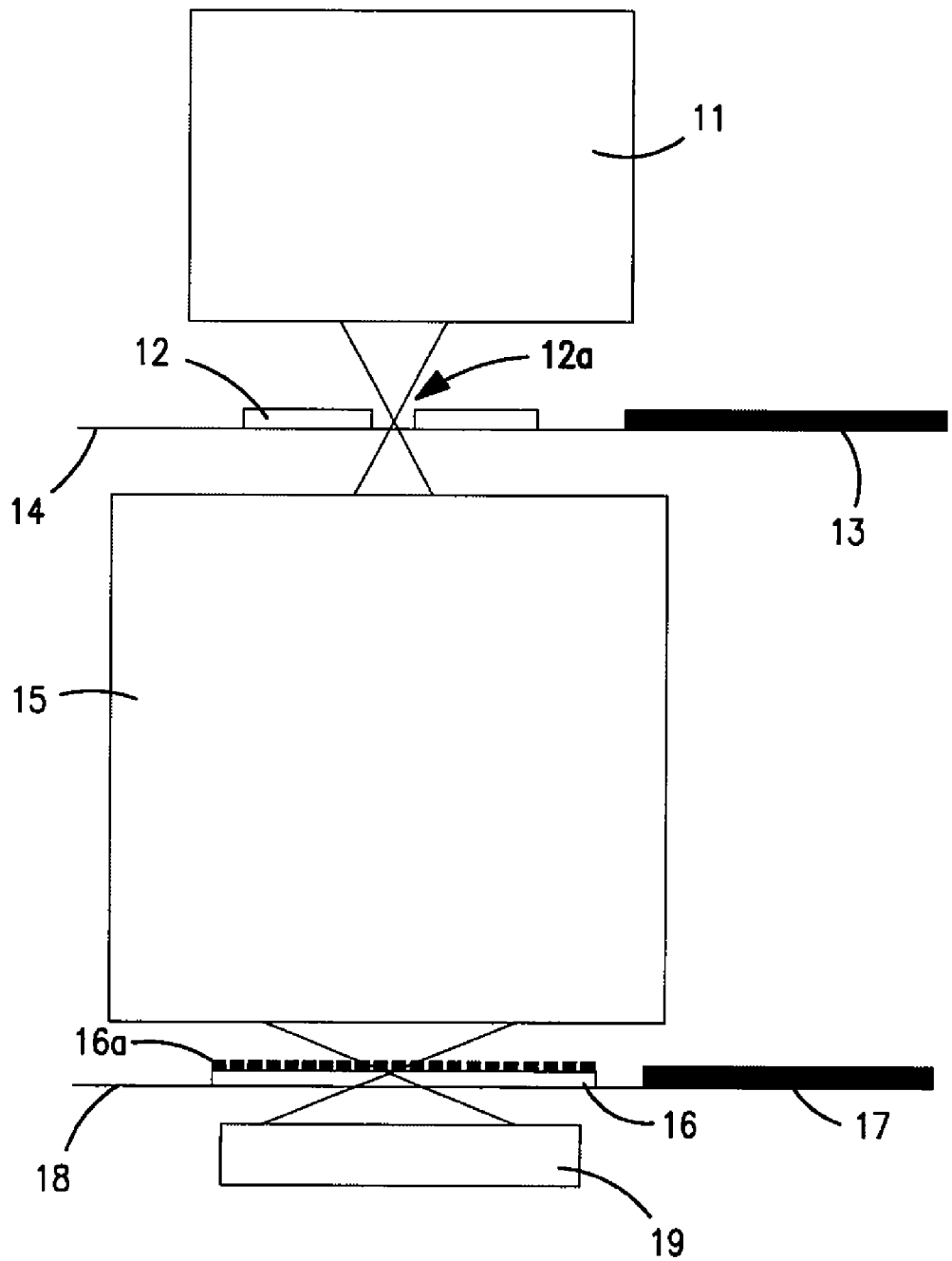
FIG. 22 is a schematic block diagram of an exposure apparatus that includes a conventional interferometer.

First, a description will be given of a relationship between a measurement precision and a numerical aperture (NA) of a projection optical system. FIG. 22 is a block diagram of an exposure apparatus 10 that includes an interferometer that measures an optical performance of a projection optical system 15. A controller (not shown) drives a reticle stage 14 and a wafer stage 18 and provides a reticle 13 and a wafer 17 on an optical path at exposure. Then, a circuit pattern (not shown) on the reticle 13 is illuminated by an illumination optical system 11 and printed on the wafer 17 through the projection optical system 15. Usually, a NA of a light entering the projection optical system 15 from the illumination optical system 11 is smaller than a NA of a light exiting from the projection optical system 15 for a magnification of the projection optical system 15. The present invention pays attention to the NA of the light exited from the projection optical system 15, and this defines as the NA of the projection optical system in this application.

When the optical performance of the projection optical system 15 is measured, the controller drives the reticle stage 14 and the wafer stage 18 and provides a substrate for interference measurement at the reticle side 12 and a substrate for interference measurement at the wafer side 16 on the optical path. The substrate for interference measurement at the reticle side 12 includes, for example, a pinhole 12a, and the substrate for interference measurement at the wafer side 16 includes, for example, a grating 16a.

The light passed through the illumination optical system and exited from the pinhole 12a provided the substrate for interference measurement at the reticle side 12 penetrates the projection optical system 15 and becomes a light with an aberration information of the projection optical system 15. The grating 16a divides the light into each order component and forms an interference fringes by overlapping them. Thereby, this interferometer is a LSI, and a light intensity sensor (CCD) measures the interference fringes.

Figure 23:
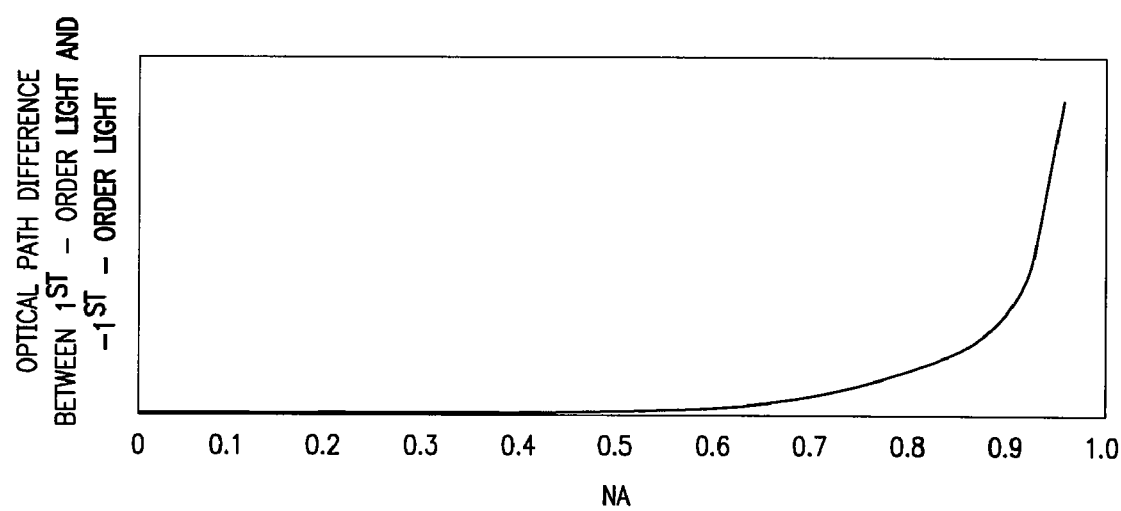
FIG. 23 is a graph of a relationship of an optical path difference between a numerical aperture of a projection optical system and $\pm 1^{st}$ order light.

FIG. 23 shows a relationship of an optical path difference between the NA obtained by the exposure apparatus 10 and $\pm 1^{st}$ order light. Data has disappeared in ranges where NA exceeded 0.9. This is because the $\pm 1^{st}$ order light becomes an evanescent wave if NA is high, and does not exit from the grating. Although the optical path difference certainly changes according to a pitch of the grating 16a and a position of the light intensity sensor 19, the optical path difference is, as shown in FIG. 23, almost 0 in the range of NA to 0.5. However, the optical path difference rapidly increases when the NA exceeds 0.6. Because this optical path difference is measured as the interference fringes, the rapidly increase of the optical path difference causes the following problems.

Figure 24A:
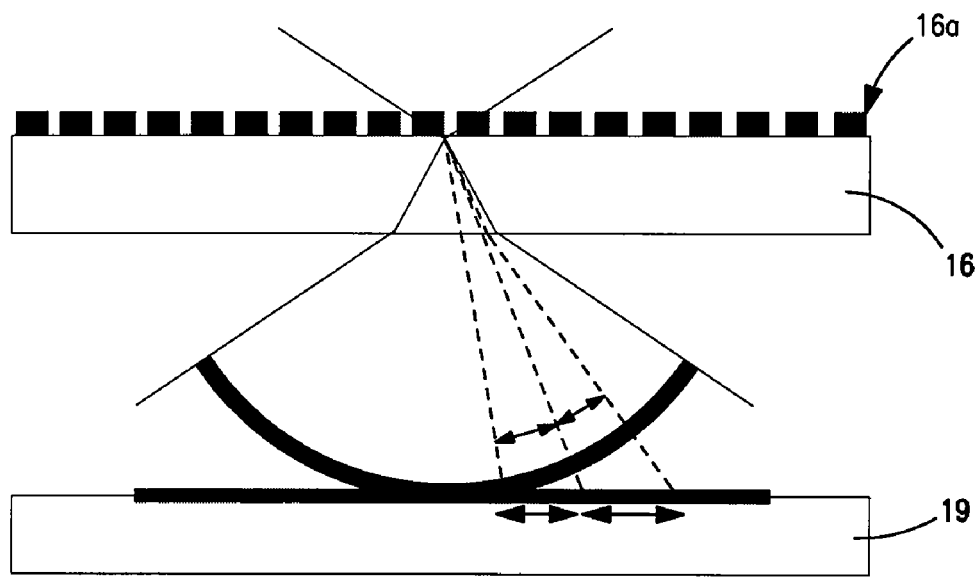
FIGS. 24A and 24B are views for explaining problems of the conventional interferometer that receives a light having a higher numerical aperture.
Figure 24B:
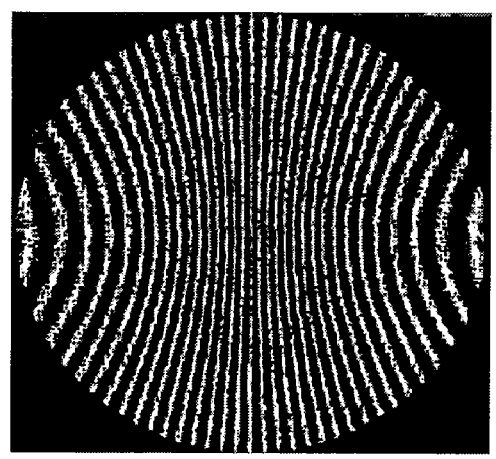

One of the problems is a curvature of the interference fringes. The light intensity sensor 19 receives, as shown in FIG. 24A, a spherical wave at a plane, and measures the interference fringes shown in FIG. 24B. Then, a computing unit (or controller) of the interferometer image-analyzes the obtained interference fringes, and calculates a wave front aberration of the projection optical system 15. In order to measure the wave front aberration of the projection optical system 15 with high precision, it is necessary to acquire the information of the interference fringes from 0 to the maximum NA with respect to the NA of the projection optical system 15 (in other words, information of the whole surface of the projection optical system 15) within the limit of measurement accuracy of the light intensity sensor 19.

However, if the NA of the projection optical system 15 is higher, a curvature of the wave front becomes large, and the interference fringes greatly curves in circumference of the interference fringes even if the aberration does not exist.

Another is a problem that the interference fringes covering the entire surface of the projection optical system cannot be measured. The optical path is related to a pitch difference between the interference fringes of the center and the circumference. When the optical path difference in the NA of 0.5 or less is 0, the interference fringes with the equal pitch are obtained in the entire NA of the projection optical system. However, when the optical path difference exists, the pitch difference between the interference fringes of the center and the circumference is caused. Even if this pitch difference slightly exists, the interference fringes in the entire NA of the projection optical system should be measured. However, when the NA exceeds 0.6, the optical path difference rapidly increases, and the pitch of the interference fringes of the center part shown in FIG. 24B becomes smaller than a pixel size of the light intensity sensor 13.

Therefore, a spacing of the interference fringes is narrower for the light intensity sensor 13, and plural interference fringes are detected as one thick line. Actually, the light intensity sensor with 1 pixel to several pixels is needed to measure 1 interference fringe, and if the spacing of the interference fringes is narrower, information on the area is missing.

Then, when the light intensity sensor is adjusted so that the fine interference fringes of the center part can be measured, the interference fringes of which spacing is wide in circumference cannot be measured. Moreover, when the light intensity sensor is adjusted so that the interference fringes of which spacing is wide in circumference can be measured, the fine interference fringes of the center part cannot be measured. Thereby, when the NA exceeds 0.6, the light intensity sensor cannot measure the interference fringes of the entire NA at once. Such pitch difference of the interference fringes and increase of the curved cause the precision deterioration of the image analysis and the long analyzing time. Moreover, if the interference fringes covering the entire NA of the projection optical system cannot be measured at once, the image analysis cannot be executed, and the wave front cannot be measured. Therefore, when the NA exceeds 0.6, the optical performance of the projection optical system cannot be measured with high precision.

Figure 25:
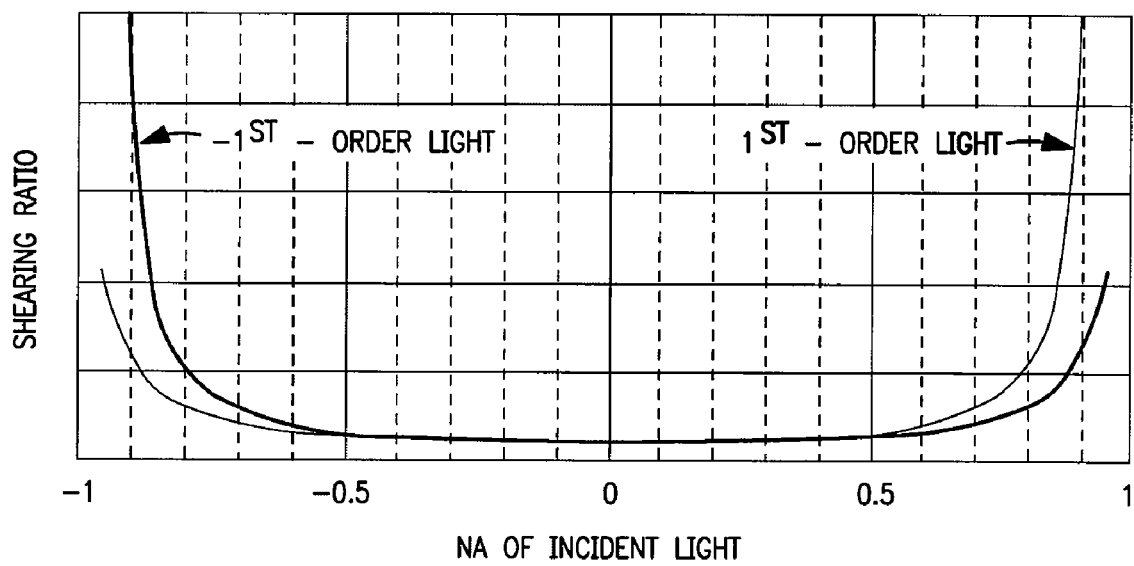
FIG. 25 is a graph of a relationship of the numerical aperture of the projection optical system and a shearing ratio.

Moreover, in the LSI using the grating 12a shown in FIG. 23, the shearing ratio (an amount corresponding to a shift amount between a $0^{th}$ order light and $\pm 1^{st}$ order light) differs at the center part and the circumference of the wave front by the increase of the NA. In other words, the shearing ratio changes at the position. The shearing ratio is a lateral shift amount of the wave front by the grating 16a, when the NA is small, the lateral shift amount of the wave front is almost constant, and simply, it can be considered that the wave front shifts in the lateral direction. However, the lateral shift amount changes in the position by the increase of the NA, the lateral shift amount in a center of the light and an edge of the light differ, and the lateral shift amount increases as for the edge of the light. FIG. 25 shows a relationship between the shearing ratio and the NA. When the NA is higher than 0.6, the shearing ratio of $\pm 1^{st}$ order diffraction light rapidly increases as shown in FIG. 25.

A description will be given of a measurement error and a reduction of image processing error by being the NA of the projection optical system to 0.6 or less. As above-mentioned, if the NA is more than 0.6 and the optical path difference increases, the interference fringes curve, and the interference fringes covering the entire NA of the projection optical system cannot be measured. In this case, first, the interference fringes of only the center part are measured, next, the circumference part is plurality measured for an area, which can be measured, and the information of the entire interference fringes is created by synthesizing the plural images by the image processing. Thereby, error factors by the increase of the number of measurement and differing the measurement conditions of each interference fringes increase, and the increase of the image processing time and the precision deterioration of the plural image in a connection boundary.

Therefore, the good interference fringes of the entire NA of the projection optical system can be obtained by decreasing the NA to 0.6 or less by a numerical aperture decreasing part, which is a characteristic of the present invention. Thereby, the number of measurement is become to the minimum, the error factors by the measurement can be reduced, and the image processing time and error factor can be reduced. As the result, the present invention can measure the wave front with high precision.

On the other hand, the measurement using the interferometer uses, usually, parallel light in many cases. However, when the NA of the projection optical system increases, it is difficult to design a collimator lens for closing to the parallel light with a NA of 0.25 or less. The interferometer using the exposure light needs the shortest optical path because a coherence of the exposure light is low, but the higher NA of the projection optical system causes an increase in the number of collimator lenses, and the optical path length becomes longer. The increase of the number of lenses causes an enlargement of the interferometer, especially, when the interferometer is mounted to the exposure apparatus, and a problem of arrangement occurs. Moreover, if the number of collimator lenses increases, an assembly error of the collimator lenses increases, and the error factor not only increases, but a system error component for dividing the optical performance of the projection optical system and the collimator lenses becomes complicated. In addition, the increase of the number of lenses decreases the light intensity and the coherence, and the measurement with high precision cannot be executed as a result.

Hereafter, with reference to the accompanying drawings, a description will be given of exposure apparatuses as various embodiments.

First Embodiment

Figure 1:
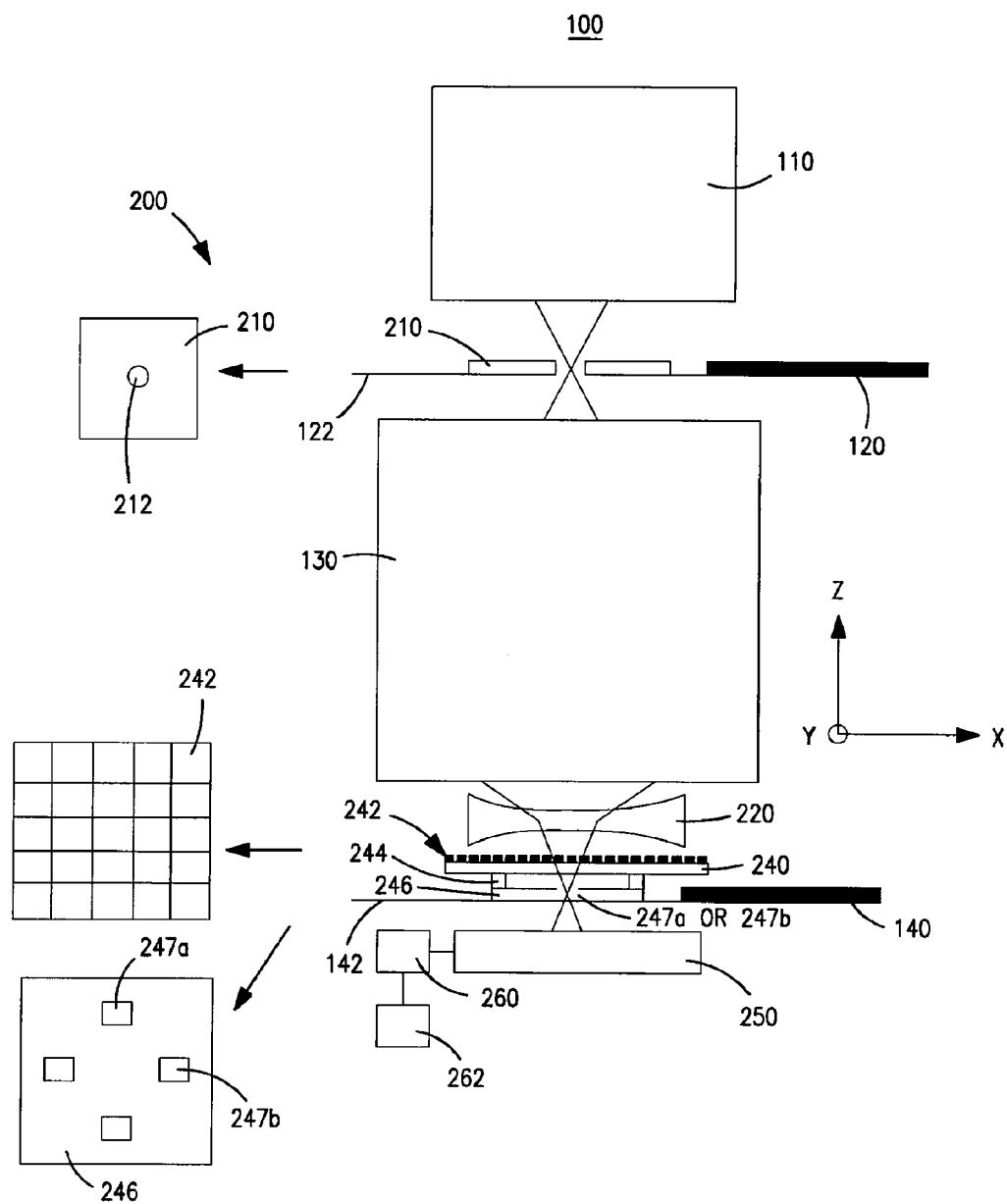
FIG. 1 is a schematic block diagram of an exposure apparatus as a first embodiment according to the present invention.

FIG. 1 is a schematic block diagram of an exposure apparatus 100 as the first embodiment according to the present invention. The exposure apparatus 100 is a projection exposure apparatus to expose a circuit pattern of a reticle 120 onto an object (plate) 140, e.g., in a step-and-scan or a step-and-repeat manner. Such an exposure apparatus is suitably applicable to a submicron or quarter-micron lithography process, and in the following embodiment, a step-and-scan exposure apparatus (which is also called "a scanner") is described as an example.

The exposure apparatus 100 includes a measuring apparatus 200, an illumination apparatus, the reticle 120, a projection optical system 130, and the plate 140.

The illumination apparatus illuminates the reticle 120 that has the circuit pattern to be transferred, and includes a light source section (not shown) and an illumination optical system 110. The light source section may use a light source such as an ArF excimer laser with a wavelength of approximately 193 nm and a KrF excimer laser with a wavelength of approximately 248 nm. A kind of laser is not limited to excimer laser, and the number of laser units is not limited. The illumination optical system 110 is an optical system that uniformly illuminates the reticle 120, and includes a lens, a mirror, an optical integrator, a σ stop, and the like.

The reticle 120 is made, for example, of quartz, and has the circuit pattern (or an image) to be transferred. The reticle 120 is supported and driven by a reticle stage 122. The reticle stage 122 has the same structure as a wafer stage 142 described later, and supports and drives a part of the measuring apparatus 200. The reticle stage 122 provides the reticle 120 on the optical path at exposure, and provides a substrate 130 on the optical path at measurement of the optical performance of the projection optical system 130. The diffracted light from the reticle 120 passes the projection optical system 130, and then is projected onto the plate 140. The mask 120 and the plate 140 are located in optically conjugate relationship. Since the exposure apparatus 100 is the scanner, the reticle 120 and the plate 140 are scanned at a speed ratio of the reduction ratio. Thus, the pattern of the reticle 120 is transferred to the plate 140. If the exposure apparatus 100 is a step-and-repeat exposure apparatus (referred to as a "stepper"), the reticle 120 and the plate 140 remains still when exposing the reticle pattern.

The projection optical system 130 may use an optical system comprising solely of a plurality of lens elements, an optical system including a plurality of lens elements and at least one concave mirror (a catadioptric optical system), a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit. The projection optical system 130 of the present invention has a NA of more than 0.6 at wafer side.

The plate 140 is an exemplary object to be exposed, such as, a wafer and a LCD. A photoresist is applied to the plate 140. The plate 140 is supported by the wafer stage 142 via a chuck (not shown). The wafer stage 142 supports the plate 140 and a part of the measuring apparatus 200. The wafer stage 142 provides the plate 140 on the optical path at exposure, and provides a substrate 240 on the optical path at measurement of the optical performance of the projection optical system 130. The wafer stage 142 may use any structures known in the art. A detailed description of its structure and operation is omitted. The wafer stage 142 may use, for example, a linear motor to move the plate 140 and a part of the measuring apparatus 200. The reticle 120 and the plate 140 are, for example, scanned synchronously. The positions of the wafer stage 142 and reticle stage 122 are monitored, for example, by the interferometer (not shown), so that both are driven at a constant speed ratio.

The measuring apparatus 200 measures the optical performance (for example, a wave front aberration) of the projection optical system 130 using the exposure light or a light source for the interferometer. The measuring apparatus 200 includes a substrate (or mask) at the reticle side 210, a numerical aperture decreasing part 220, a substrate (or mask) at wafer side 240, an order selecting window 244, a detector 250, a controller 260, and a memory 262. The measuring apparatus 200 includes an interferometer that measures the optical performance of the projection optical system 160 as the optical system under test by detecting the interference fringes, and uses the LSI as the interferometer. However, the measuring apparatus 200 may use the PDI or LDI as described later.

The substrate 210 is a pinhole board, and is provided on a predetermined object point in an object surface position of the projection optical system 130. The substrate 210 includes a pinhole 212 to form a spherical wave of a measurement light.

The numerical aperture decreasing part 220 decreases a numerical aperture of a light exited from the projection optical system 130 to 0.6 or less. The numerical aperture decreasing part 220 of the instant embodiment is a concave lens provided before an imaging point (focal point) on the plate at exposure. The number of lenses included the numerical aperture decreasing part 220 is not limited to 1. The numerical aperture decreasing part 220 may be a lens unit that includes plural lenses having a negative power.

The numerical aperture decreasing part 220 does not need to generate a completely parallel light and may narrow so that the light entered the substrate for interference measurement or the light entered the light intensity sensor becomes a light with a NA of 0.25 or more and 0.6 or less. If the NA is 0.6 or less, the measurement precision can be within tolerance. If the NA is 0.25 or more, the increase of the optical path length by introducing the collimator lens unit can be reduced. The collimator that controls the numerical aperture of the projection optical system so that the NA becomes 0.25 or more and 0.6 or less is a simply structure, can set a coherence distance and the light intensity in tolerance, and can maintain a predetermined measurement precision.

The numerical aperture decreasing part 220 is not limited to the concave mirror. The numerical aperture decreasing part 220 may use a diffractive optical element, such as a binary optics, a Fresnel zone plate, and a Fresnel lens.

The substrate 240 includes a grating pattern 242 at the projection optical system side, and coupled with the order selecting window 246 at the plate side via a connecting part 224. As the result, the substrate 240 and the order selecting window 246 drive together.

The substrate 210 may use a slit or a grating, and the substrate 240 may use a double slit or a structure that includes a slit and a window. The grating may use an amplitude grating constituted by providing a light-shielding part, such as Cr, in a glass substrate, and a phase grating that has a phase difference by an incision of the glass. When the grating is used, two $1^{st}$ order gratings in X and Y directions may be used, and a $2^{nd}$ order grating that has a hounds-tooth check shape may be used. Moreover, an image shifted the phase can be obtained by moving only grating in an orthogonal direction to the optical axis using the stage, and a phase information of the projection optical system may be obtained from these plural image.

The order selecting window 244 is provided the imaging point at the plate 140 side, and cuts unnecessary light, such as high order light generated in the grating 242. The order selecting window 244 includes, for example, a couple of square window 247a that aligners in the X direction and is same shape, and a couple of square window 247b that aligners in the Y direction and is same shape. The window 247a and the window 247b exists on same the order selecting window 244, and can adjust a distance between the patterns with an electron beam forming precision (almost 50 nm) manufactured the order selecting window 244. The position of the order selecting window 244 is adjusted so that the image ($0^{th}$ order light) is formed at the center of the two windows 247a for the shearing measurement in the X direction. The substrate 240 that includes the $2^{nd}$ order grating 242 is designed and provided so that the $\pm 1^{st}$ order light passes the center of the two windows 247a. The shearing ratio of the $\pm 1^{st}$ order light is determined based on an interval of window 247a, a distance between the grating 242 and the order selecting window 244, a spacial frequency needed for a wave front reconstruction, and a contrast needed for the interference fringes, etc. Moreover, the order selecting window 244 is aligned so that the image ($0^{th}$ order light) is formed at the center of the two windows for the shearing measurement in the Y direction As the result, the XY component can be measured at the same time. Of course, the present invention may time-serially take in the XY component by dividing the window 247a and the window 247b in the X direction.

The detector 250 is a detector, such as back-irradiating type CCD, a camera, and other interference fringes pick-up image means. The controller 260 controls the reticle stage 122 and the wafer stage 142, analyzes the wave front by obtaining the shearing interference information detected by the detector 250, and calculates the wave front aberration of the projection optical system 130. The memory 262 stores information and result needed for the control and calculation by the controller 260.

In operation of the measuring apparatus 200, the light exited from the pinhole 212 of the structure 210 becomes a light having the aberration information of the projection optical system 130 by passing though the projection optical system 130. This light is narrowed by the numerical aperture decreasing part 220, passes through the grating pattern 242, and images on the order selecting window 244. The grating 142 divides the light into each order component, and the order selecting window 246 remove the $0^{th}$ order light and high order diffraction light. As the result, only $\pm 1^{st}$ order light penetrates the window 247a and the window 247b, and they form the interference fringes by overlapping. The detector 250 detects the interference fringes.

The controller 260 calculates the wave front from the interference fringes, and obtains the optical information of the projection optical system.

Concretely, the detector 250 measures the interference fringes formed by the $\pm 1^{st}$ order light penetrated the window 247a and the window 247b. The instant embodiment uses a Fourier transform method to obtain the phase (wave front) information from the interference fringes.

First, the Fourier transform method $2^{nd}$ order Fourier-transforms the interference fringes. In the spacial frequency, an interference spectrum corresponding to each shearing wave front in the X direction and the Y direction. Two of the differential wave in the X direction and the wave front difference in the Y direction are obtained by an inverse Fourier transform of the frequency distribution. Since these phase information is a discrete information for 360 degree, these phase information is phase-connected (unwrap) so that the phase smoothly connect.

There are various techniques for obtaining the phase information from the interference fringes beside the above Fourier transform method.

One is an electron moiré method. This method observes the interference fringes image included a carrier fringes by the image pick-up means. On the other hand, a computer generates three or more reference grating pattern signals that have the same frequency as the interference fringes image and shifts the phase of a predetermined amount, and multiples a measurement interference fringes signal respectively. The phase distribution is obtained from three or more moiré interference fringes image obtained by extracting the low frequency component from the signal obtained by the multiplication.

There is a phase shift method for the higher precision. This method drives the grating in the orthogonal direction to the optical axis, and calculates the differential phase information from plural image shifted the phase. First, the grating is driven in the X direction, and the differential wave in the X direction is calculated from the plural image shifted the phase. Also, the grating is driven in the Y direction, and the differential wave in the Y direction is calculated from the plural image shifted the phase. It is the same structure even if it uses two line gratings in the X direction and the Y direction.

The instant embodiment is the shearing interferometer using the grating, and calculates the wave front difference. Therefore, the original wave front (in other words, the optical information of the projection optical system) can be obtained by integrating with such differential wave.

As above-mentioned, the differential wave in the X direction and the differential wave in the Y direction can be obtained from various methods. Therefore, the optical information of the projection optical system can be obtained by synthesizing and integrating these two differential waves.

It is necessary to separate the optical property (system error) of the numerical aperture decreasing part 220 from the detection result by the detector 250 to measure the optical property of the projection optical system 130 with high precision. The system error may measure the optical property of the numerical aperture decreasing part 220 and stores it in the memory 262. Moreover, the projection optical system 130 is measured by another higher performance measuring apparatus, and the differential may be the system error.

Second Embodiment

Figure 2:
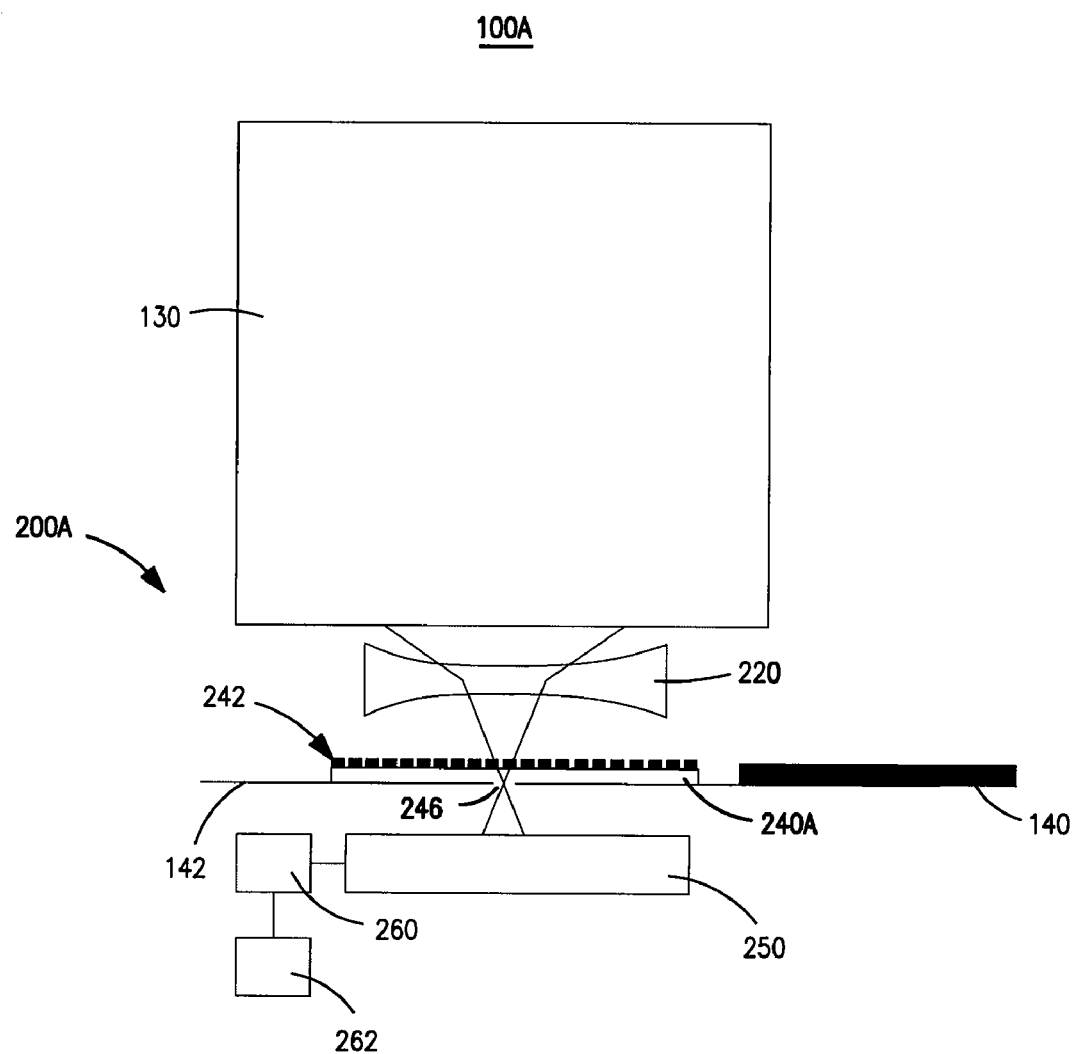
FIG. 2 is a schematic partially block diagram of a measuring apparatus of an exposure apparatus as a second embodiment according to the present invention.

Referring to FIG. 2, a description will be given of an exposure apparatus 100A as the second embodiment according to the present invention. Here, FIG. 2 is a schematic block diagram of a measuring apparatus 200A after the projection optical system 130 of the exposure apparatus 100A. In FIG. 2, the same reference numeral denotes the same element. Therefore, duplicate descriptions will be omitted. The exposure apparatus 100A is different form the exposure apparatus 100 in that the exposure apparatus 100A has a substrate for interference measurement at the wafer side 240A instead of the members 240 to 246. The substrate 240A includes the grating pattern 242 at the surface, and an order selecting window 246A that cuts the higher order light at the back surface. The exposure apparatus 100A can be miniaturized, can simplify structure, and can shorten distance between the grating 242 and the order selecting window 246A, as compared with the exposure apparatus 100

Third Embodiment

Figure 3:
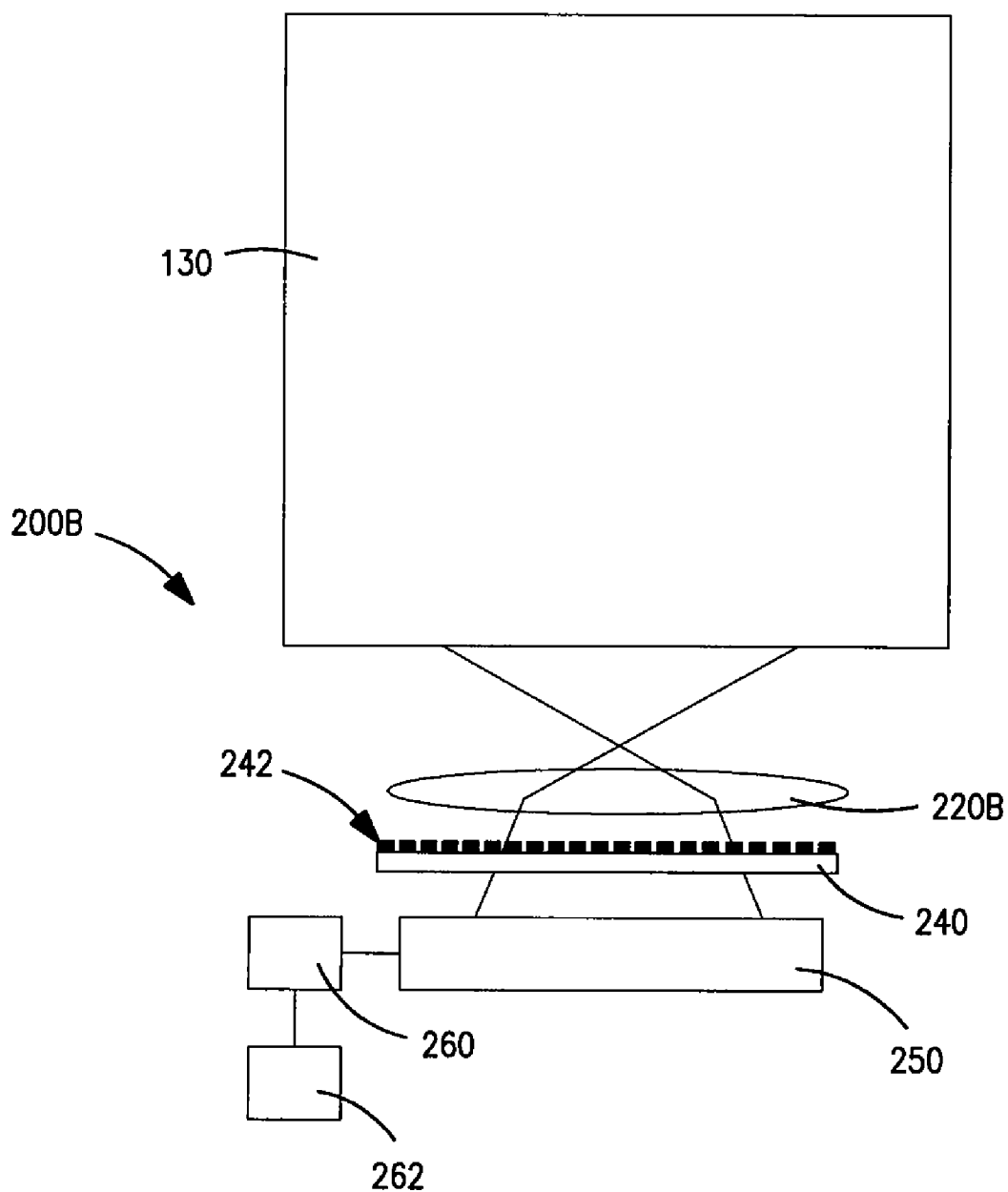
FIG. 3 is a schematic partially block diagram of a measuring apparatus of an exposure apparatus as a third embodiment according to the present invention.

Referring to FIG. 3, a description will be given of an exposure apparatus 100B as the third embodiment according to the present invention. Here, FIG. 3 is a schematic block diagram of a measuring apparatus 200B after the projection optical system 130 of the exposure apparatus 100B. In FIG. 3, the same reference numeral denotes the same element. Therefore, duplicate descriptions will be omitted. The measuring apparatus 200B is different form the measuring apparatus 200 in that a convex lens 220B as the numerical aperture decreasing part is provided after the focal point of the projection optical system 130. The numerical aperture decreasing part 220B decreases the NA of the projection optical system 130 so that the NA of the light penetrated the projection optical system 130 becomes 0.6 or less (for example, 0.25 or more and 0.6 or less). The operation of the measuring apparatus 200B is the same as the measuring apparatus 200. The NA of the light entered the detector 250 is smaller than the NA of the projection optical system 130 by the numerical aperture decreasing part 220B. The good interference fringes in the entire surface of the projection optical system are obtained because the NA of the light entered the detector 250 becomes 0.6 or less, and the measuring apparatus 200B can measure with high precision.

Fourth Embodiment

Figure 4:
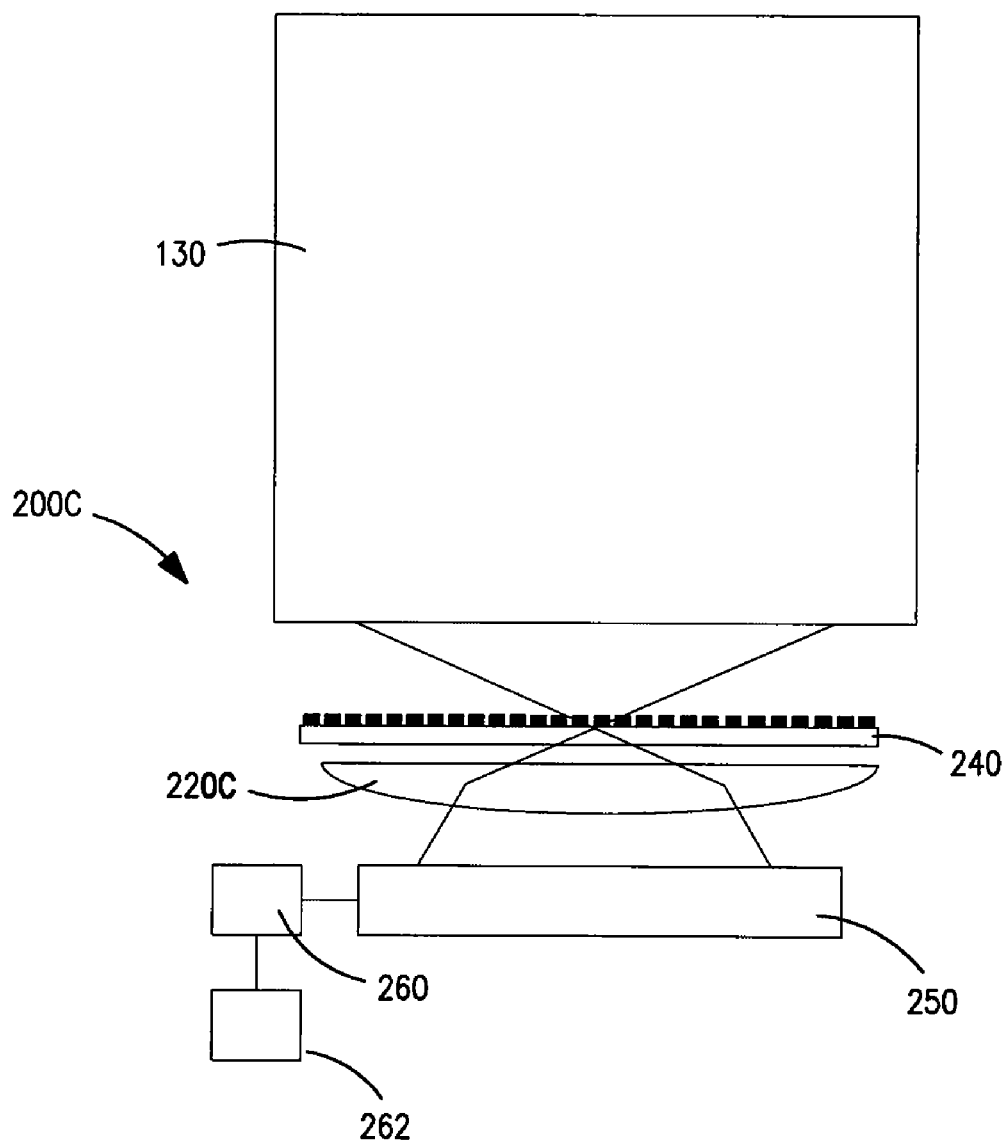
FIG. 4 is a schematic partially block diagram of a measuring apparatus of an exposure apparatus as a fourth embodiment according to the present invention.

Referring to FIG. 4, a description will be given of an exposure apparatus 100C as the fourth embodiment according to the present invention. Here, FIG. 4 is a schematic block diagram of a measuring apparatus 200C after the projection optical system 130 of the exposure apparatus 100C. In FIG. 4, the same reference numeral denotes the same element. Therefore, duplicate descriptions will be omitted. The measuring apparatus 200C is different from the measuring apparatus 200 in that a hemispheric lens 220C as the numerical aperture decreasing part is provided between the back surface of the substrate 240 and the detector 250. The numerical aperture decreasing part 220C decreases the NA of the projection optical system 130 so that the NA of the light penetrated the projection optical system 130 becomes 0.6 or less (for example, 0.25 or more and 0.6 or less). The measuring apparatus 200C provides the hemispheric lens 220C and the substrate 240 in a direction that a plane part of the hemispheric lens 220C and the back surface of the substrate 240 are united. The operation of the measuring apparatus 200C is the same as the measuring apparatus 200. The NA of the light entered the detector 250 is smaller than the NA of the projection optical system 130 by the numerical aperture decreasing part 220C. The good interference fringes in the entire surface of the projection optical system are obtained because the NA of the light entered the detector 250 becomes 0.6 or less, and the measuring apparatus 200C can measure with high precision.

Fifth Embodiment

Figure 5:
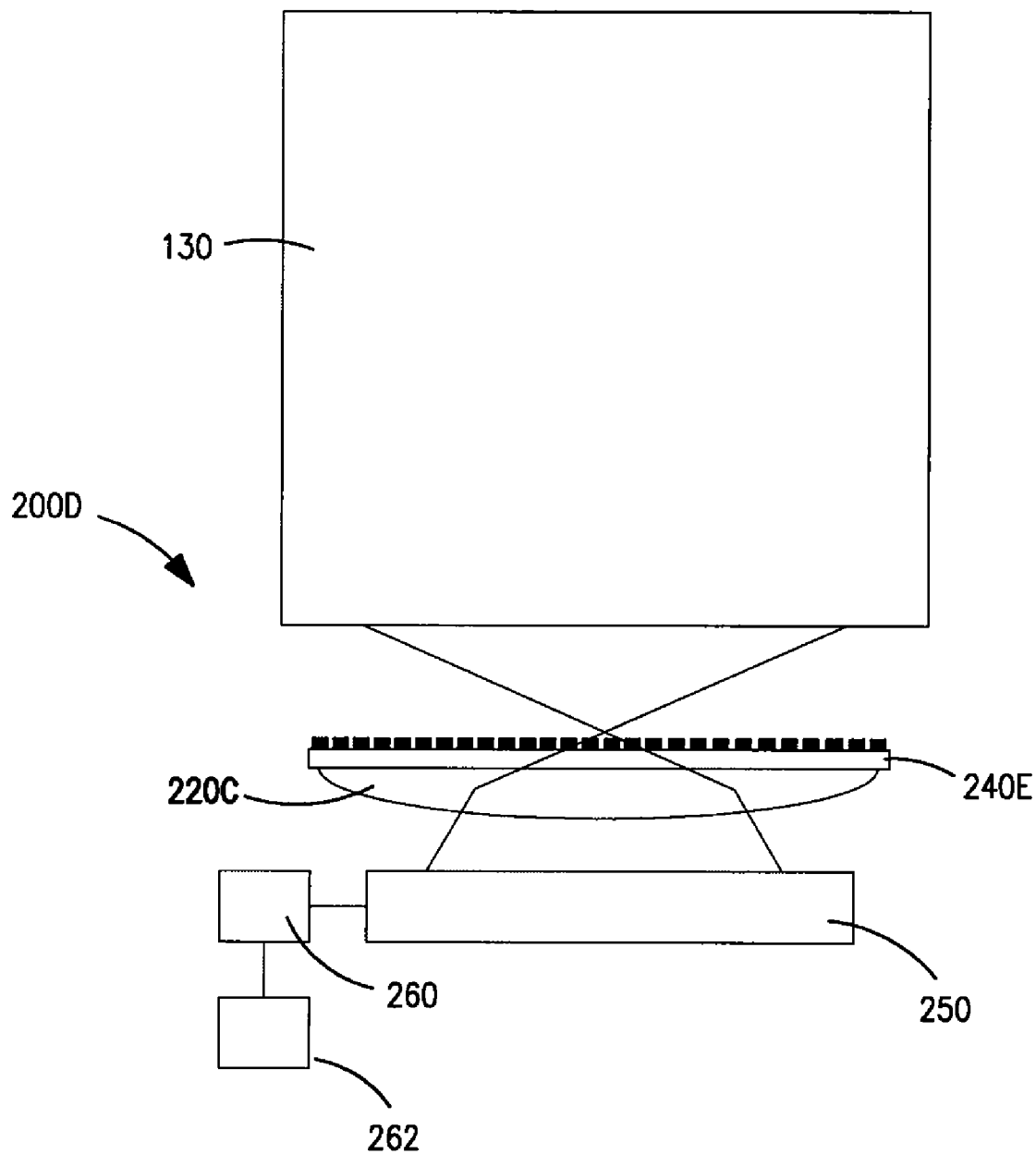
FIG. 5 is a schematic partially block diagram of a measuring apparatus of an exposure apparatus as a fifth embodiment according to the present invention.

Referring to FIG. 5, a description will be given of an exposure apparatus 100D as the fifth embodiment according to the present invention. Here, FIG. 5 is a schematic block diagram of a measuring apparatus 200D after the projection optical system 130 of the exposure apparatus 100D. In FIG. 5, the same reference numeral denotes the same element. Therefore, duplicate descriptions will be omitted. The measuring apparatus 200D is different form the measuring apparatus 200C in that the back surface of the substrate 240 optical-contacts the plane part of the hemispheric lens 220C. The operation of the measuring apparatus 200D is the same as the measuring apparatus 200C. The NA of the light entered the detector 250 is smaller than the NA of the projection optical system 130 by the numerical aperture decreasing part 220C. The good interference fringes in the entire surface of the projection optical system are obtained because the NA of the light entered the detector 250 becomes 0.6 or less, and the measuring apparatus 200D can measure with high precision.

Sixth Embodiment

Figure 6:
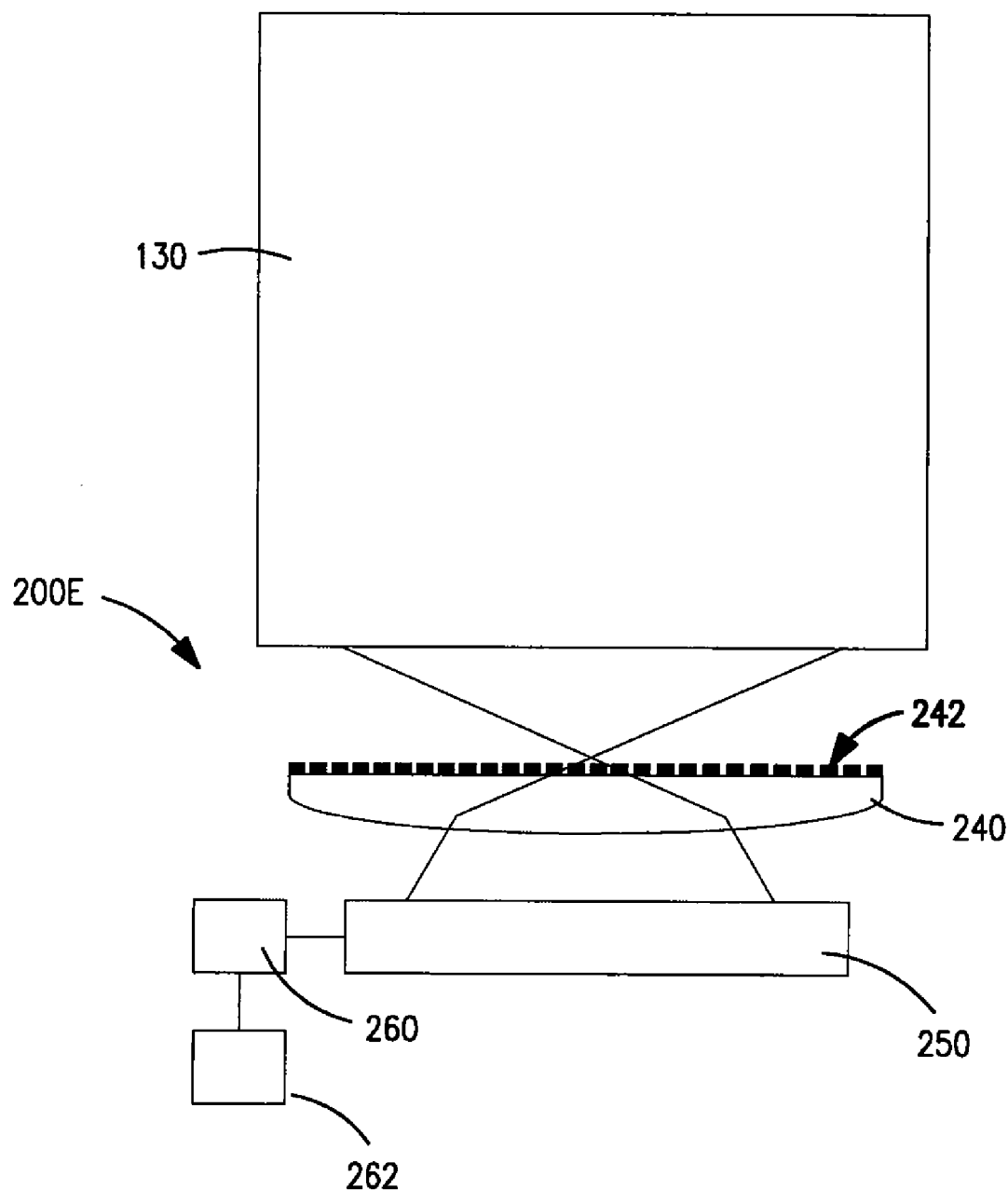
FIG. 6 is a schematic partially block diagram of a measuring apparatus of an exposure apparatus as a sixth embodiment according to the present invention.

Referring to FIG. 6, a description will be given of an exposure apparatus 100E as the sixth embodiment according the present invention. Here, FIG. 6 is a schematic block diagram of a measuring apparatus 200E after the projection optical system 130 of the exposure apparatus 100E. In FIG. 6, the same reference numeral denotes the same element. Therefore, duplicate descriptions will be omitted. The measuring apparatus 200E is different from the measuring apparatus 200D in that the measuring apparatus 200E uses a substrate 240E that has a curvature (convex) at the back surface. The operation of the measuring apparatus 200E is the same as the measuring apparatus 200D. The NA of the light entered the detector 250 is smaller than the NA of the projection optical system 130 by the substrate 240E having the function of the numerical aperture decreasing part. The good interference fringes in the entire surface of the projection optical system are obtained because the NA of the light entered the detector 250 becomes 0.6 or less, and the measuring apparatus 200E can measure with high precision.

Seventh Embodiment

Figure 7:
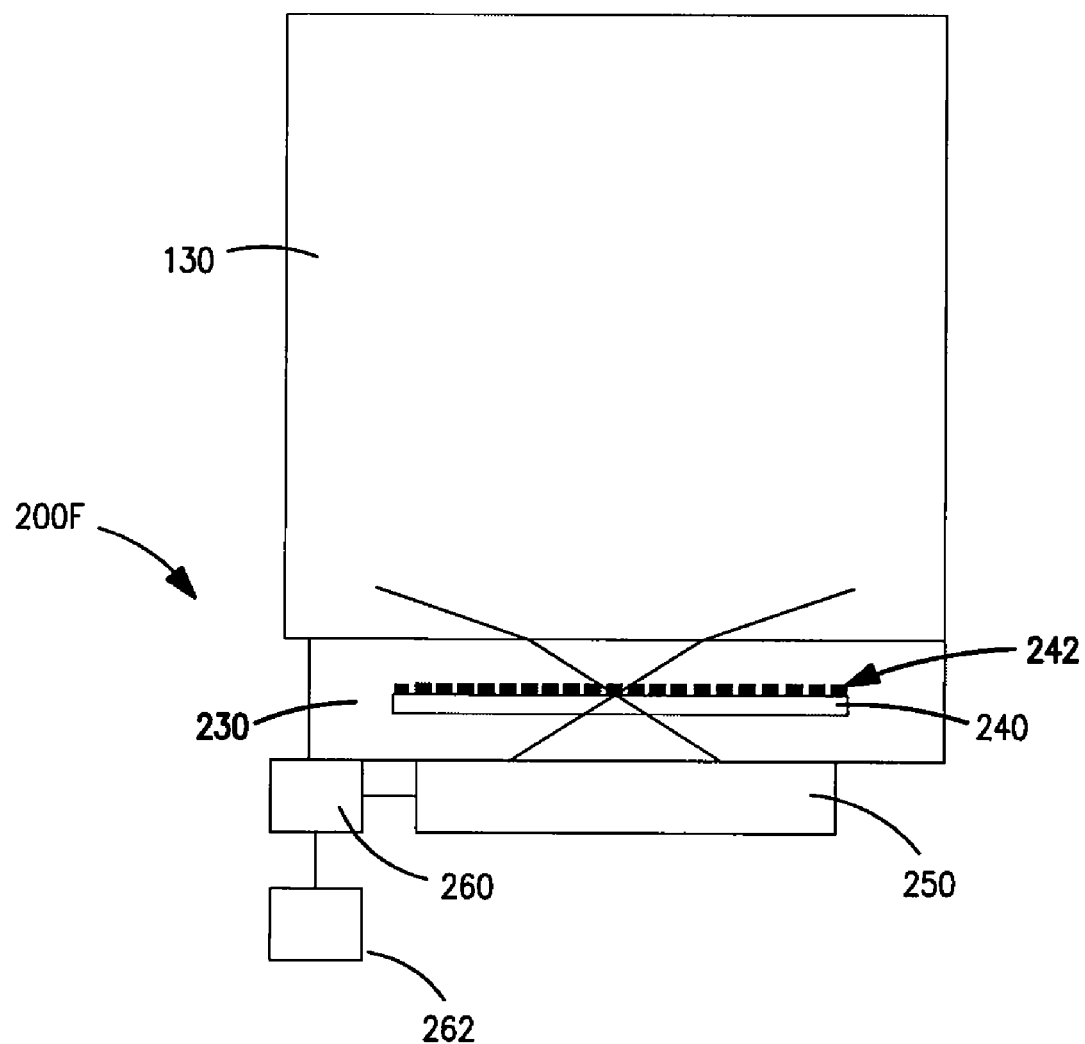
FIG. 7 is a schematic partially block diagram of a measuring apparatus of an exposure apparatus as a seventh embodiment according to the present invention.

Referring to FIG. 7, a description will be given of an exposure apparatus 100F as the seventh embodiment according the present invention. Here, FIG. 7 is a schematic block diagram of a measuring apparatus 200F after the projection optical system 130 of the exposure apparatus 100F. In FIG. 7, the same reference numeral denotes the same element. Therefore, duplicate descriptions will be omitted.

The measuring apparatus 200F is different from the measuring apparatus 200 in that the measuring apparatus 200F fills between the projection optical system 130 and the detector 250 with a liquid as numerical aperture decreasing part 220 that penetrates the exposure apparatus and has a refractive index of 1 or more. Between the projection optical system 130 and the detector 250 is between the projection optical system 150 and the substrate 240, and between the substrate 240 and the detector 250. The liquid may use a pure water that has a refractive index of 1.44 and other liquid. The operation of the measuring apparatus 200F is the same as the measuring apparatus 200. The NA of the light entered the detector 250 is smaller than the NA of the projection optical system 130 by the numerical aperture decreasing part 220. The good interference fringes in the entire surface of the projection optical system are obtained because the NA of the light entered the detector 250 becomes 0.6 or less, and the measuring apparatus 200F can measure with high precision. In the instant embodiment, the liquid is filled a space between the projection optical system 130 and the substrate 240 and a space between the substrate 240 and the detector 250. However, a different kind liquid may fill both spaces. This is the same as the following embodiment.

Eighth Embodiment

Figure 8:
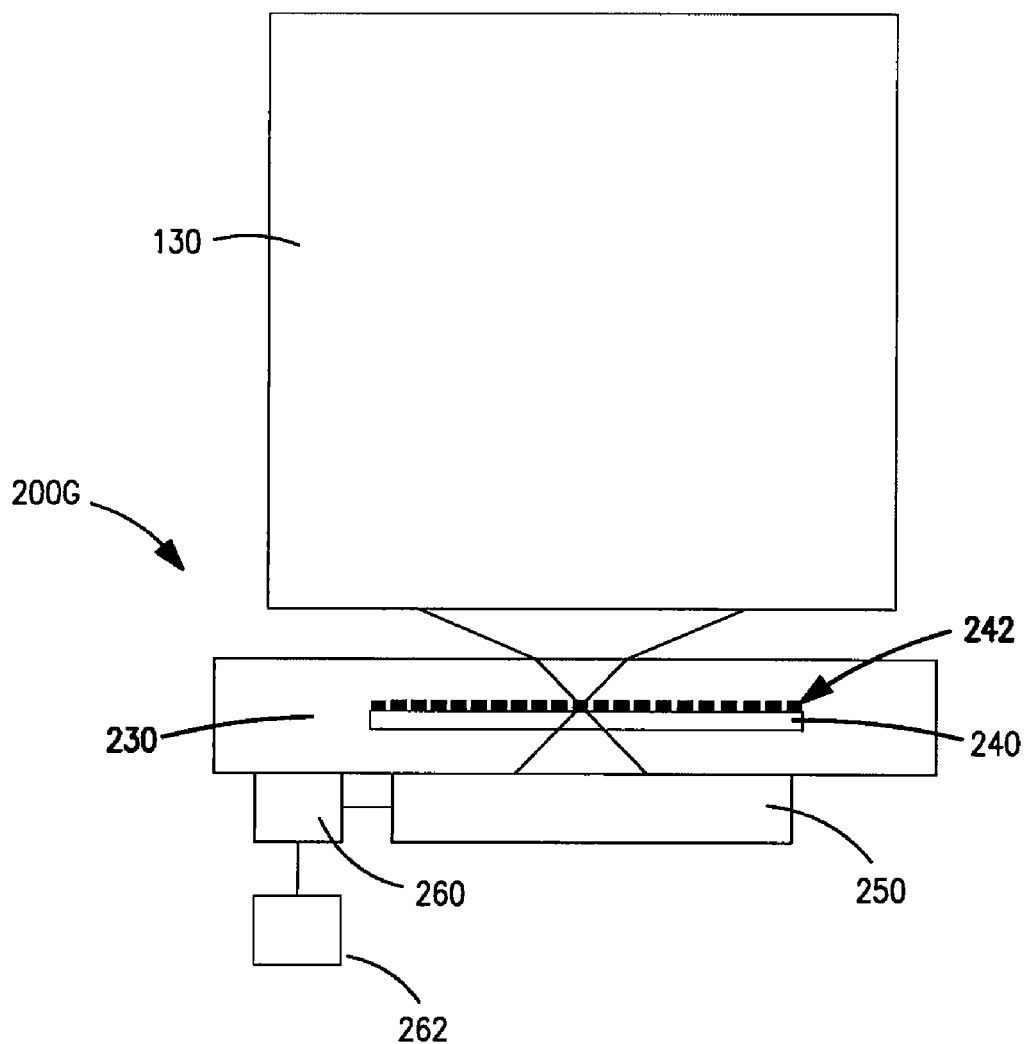
FIG. 8 is a schematic partially block diagram of a measuring apparatus of an exposure apparatus as an eighth embodiment according to the present invention.

Referring to FIG. 8, a description will be given of an exposure apparatus 100G as the eighth embodiment according the present invention. Here, FIG. 8 is a schematic block diagram of a measuring apparatus 200G after the projection optical system 130 of the exposure apparatus 100G. In FIG. 8, the same reference numeral denotes the same element. Therefore, duplicate descriptions will be omitted. Since the measuring apparatus 200G provides the last surface of the projection optical system 130 in air, can be applied to an exposure apparatus that is not the immersion exposure apparatus. The measuring apparatus 200G is filled with the liquid at only interference measurement, and a flexibility is high. The measuring apparatus 200G is different from the measuring apparatus 200 in that the final lens surface of the projection optical system 130 does not contact the liquid, and the liquid is filled from a middle between the projection optical system 130 and the substrate 240, as the numerical aperture decreasing part 220. The refractive index difference between the liquid and air decreases the NA. The operation of the measuring apparatus 200G is the same as the measuring apparatus 200F. The NA of the light entered the detector 250 is smaller than the NA of the projection optical system 130 by the numerical aperture decreasing part 220. The good interference fringes in the entire surface of the projection optical system are obtained because the NA of the light entered the detector 250 becomes 0.6 or less, and the measuring apparatus 200G can measure with high precision.

Ninth Embodiment

Figure 9:
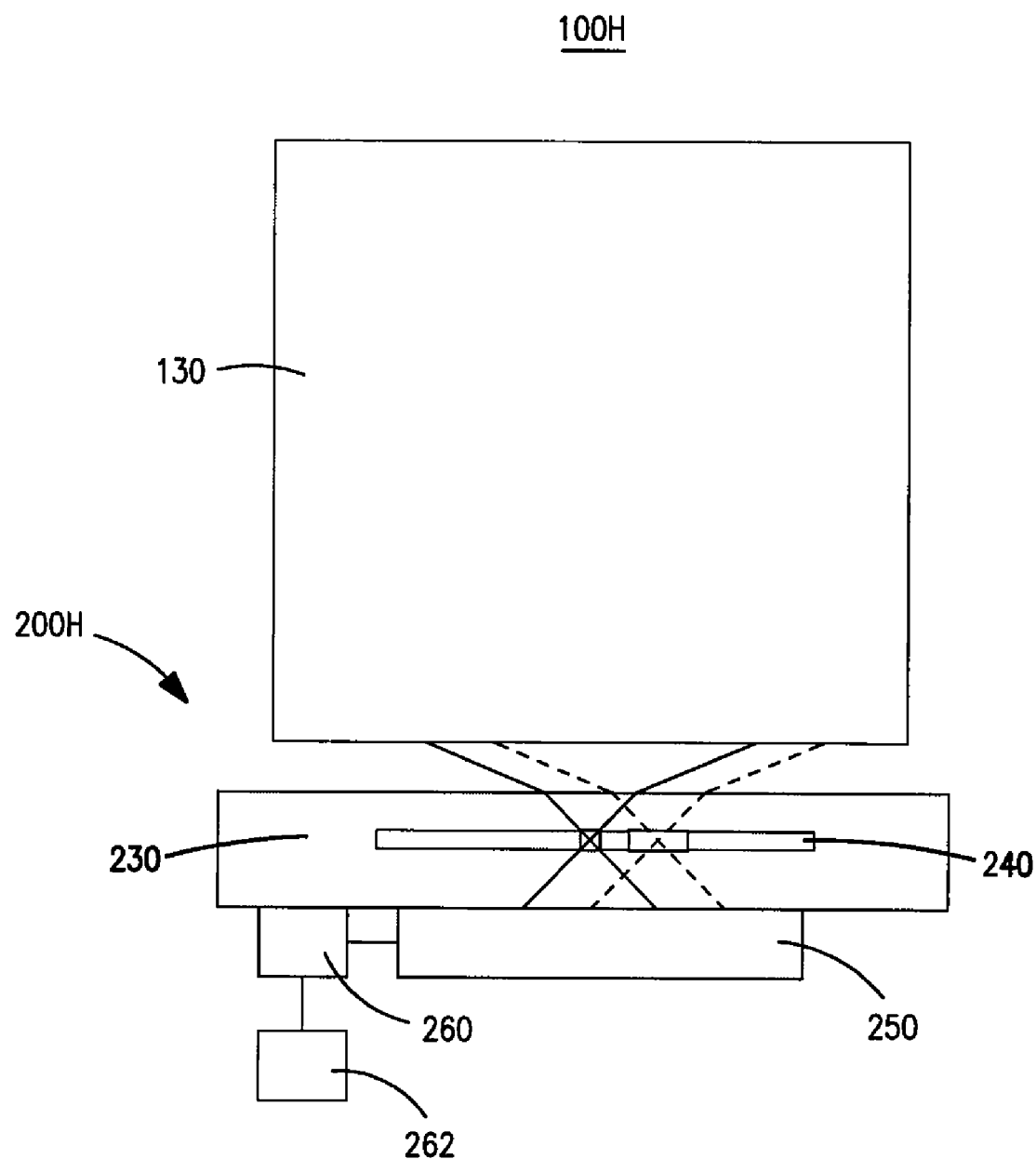
FIG. 9 is a schematic partially block diagram of a measuring apparatus of an exposure apparatus as a ninth embodiment according to the present invention.

Referring to FIG. 9, a description will be given of an exposure apparatus 100H as the ninth embodiment according the present invention. Here, FIG. 9 is a schematic block diagram of a measuring apparatus 200H after the projection optical system 130 of the exposure apparatus 100H. In FIG. 9, the same reference numeral denotes the same element. Therefore, duplicate descriptions will be omitted. The measuring apparatus 200H is different from the measuring apparatus 200G in that a substrate for interference measurement at the wafer side 240H has a pattern, such as pinhole and a window or a slit and a window, and serves as the PDI or the LDI. It is same to decrease the numerical aperture by the refractive index difference between the liquid and air.

In the operation of the measuring apparatus 200H, the ideal wave exists from the pinhole or slit, the wave included the optical information of the projection optical system 130 from the window, and detector 250 measures interference fringes of these waves. The NA of the light entered the detector 250 is smaller than the NA of the projection optical system 130 by the numerical aperture decreasing part 220. The good interference fringes in the entire surface of the projection optical system are obtained because the NA of the light entered the detector 250 becomes 0.6 or less, and the PDI and LDI can measure with high precision.

Tenth Embodiment

Figure 10:
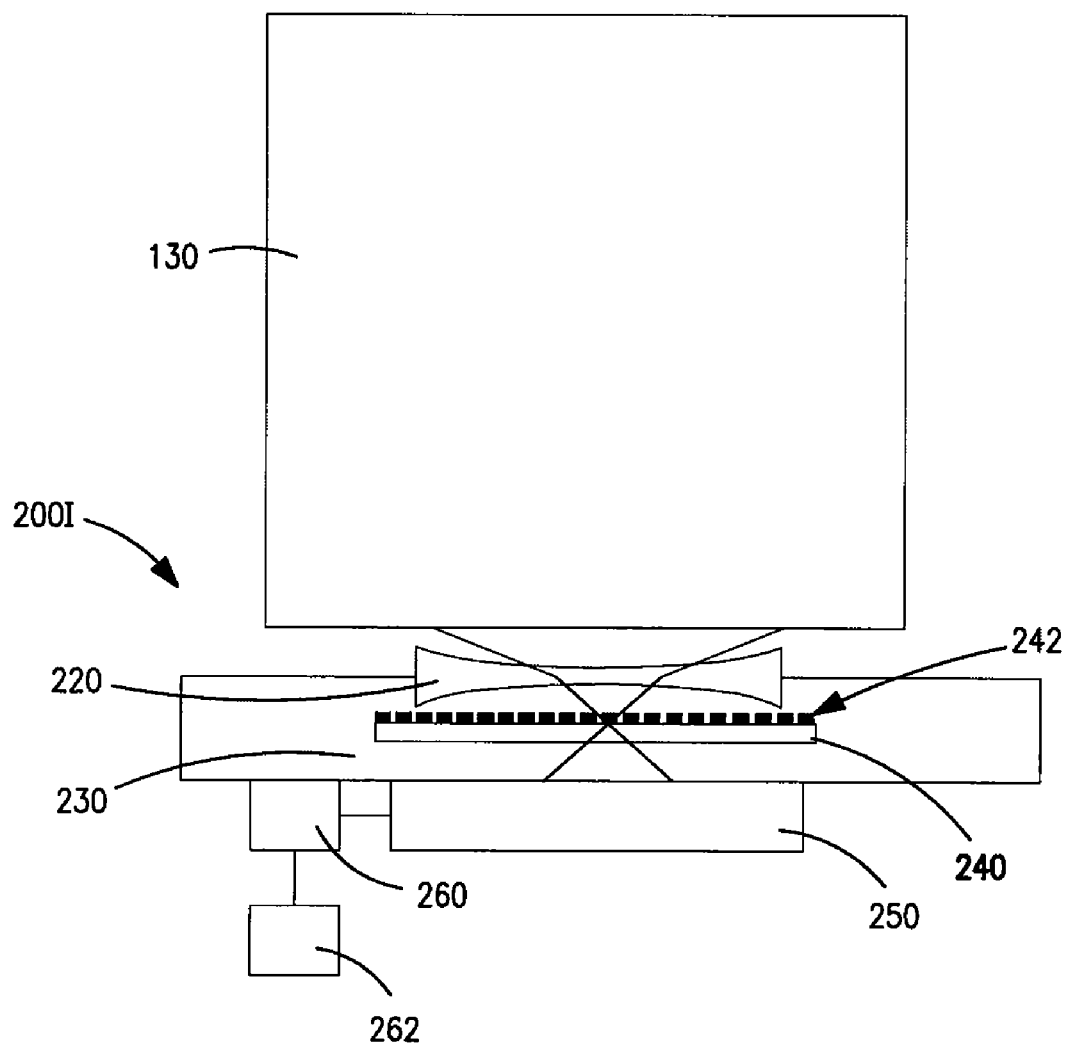
FIG. 10 is a schematic partially block diagram of a measuring apparatus of an exposure apparatus as a tenth embodiment according to the present invention.

Referring to FIG. 10, a description will be given of an exposure apparatus 100I as the tenth embodiment according the present invention. Here, FIG. 10 is a schematic block diagram of a measuring apparatus 200I after the projection optical system 130 of the exposure apparatus 100I. In FIG. 10, the same reference numeral denotes the same element. Therefore, duplicate descriptions will be omitted. The measuring apparatus 200I is different from the measuring apparatus 200G in that a concave lens 220 is provided a boundary between the liquid and air when the liquid is filled between the projection optical system 130 and the substrate 240. In other words, the measuring apparatus 200I use two kind numerical aperture decreasing parts 220 and 230. The concave lens 220 is provided before the imaging point of the projection optical system 130, and the liquid 230 that penetrates the exposure light and has a refractive index of 1 or more is filled between the projection optical system 130 and the substrate 240. The measuring apparatus 100I seals the liquid 230 by the concave lens 220. The operation of the measuring apparatus 100I is the same as the measuring apparatus 200G. The NA of the light entered the detector 250 is smaller than the NA of the projection optical system 130 by the numerical aperture decreasing parts 220 and 230. The good interference fringes in the entire surface of the projection optical system are obtained because the NA of the light entered the detector 250 becomes 0.6 or less, and the measuring apparatus 200I can measure with high precision.

Eleventh Embodiment

Figure 11:
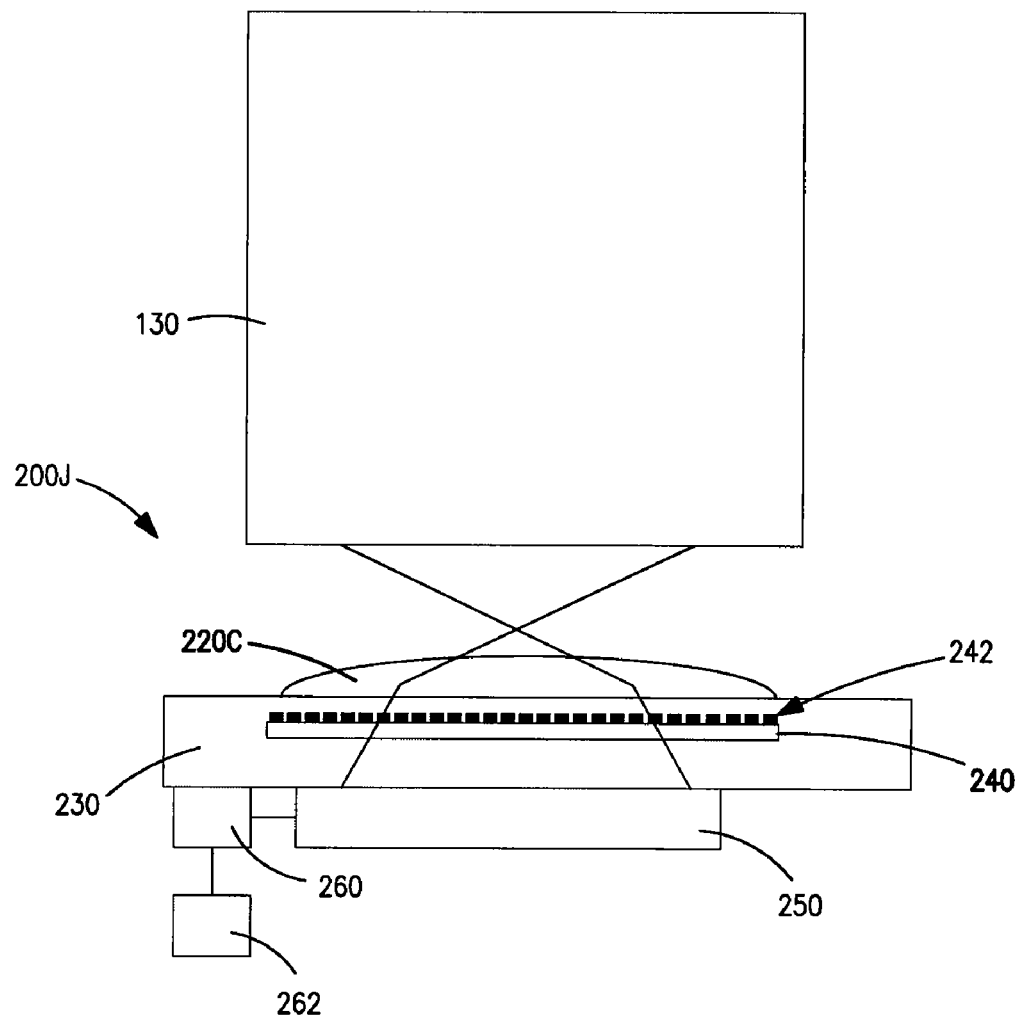
FIG. 11 is a schematic partially block diagram of a measuring apparatus of an exposure apparatus as an eleventh embodiment according to the present invention.

Referring to FIG. 11, a description will be given of an exposure apparatus 100J as the eleventh embodiment according the present invention. Here, FIG. 11 is a schematic block diagram of a measuring apparatus 200J after the projection optical system 130 of the exposure apparatus 100J. In FIG. 11, the same reference numeral denotes the same element. Therefore, duplicate descriptions will be omitted. The measuring apparatus 200J is different from the measuring apparatus 200I in that a convex lens 220C is provided the boundary between the liquid and air when the liquid is filled between the projection optical system 130 and the substrate 240. In other words, the measuring apparatus 200J uses two kinds of numerical aperture decreasing parts 220C and 230. The convex lens 230C is provided after the imaging point of the projection optical system 130, and the liquid 230 that penetrates the exposure light and has a refractive index of 1 or more is filled between the projection optical system 130 and the substrate 240. The measuring apparatus 200I seals the liquid 230 by the convex lens 220C. The operation of the measuring apparatus 200J is the same as the measuring apparatus 200I. The NA of the light entered the detector 250 is smaller than the NA of the projection optical system 130 by the numerical aperture decreasing parts 220C and 230. The good interference fringes in the entire surface of the projection optical system are obtained because the NA of the light entered the detector 250 becomes 0.6 or less, and the measuring apparatus 200J can measure with high precision. FIG. 11 shows the convex lens as hemispherical shape, and a convex lens that has a power at both surfaces may be used.

Twelfth Embodiment

Figure 12:
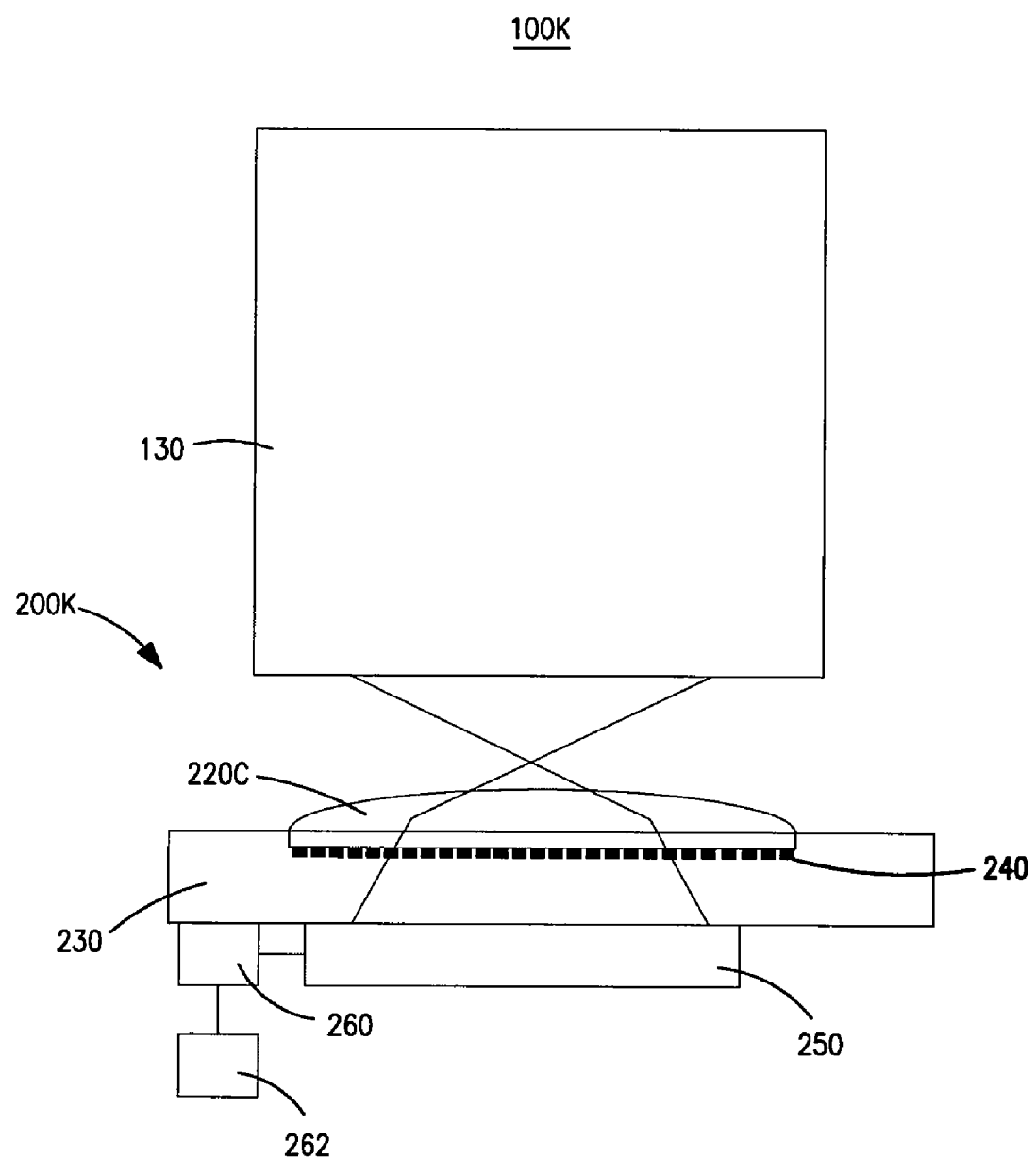
FIG. 12 is a schematic partially block diagram of a measuring apparatus of an exposure apparatus as a twelfth embodiment according to the present invention.

Referring to FIG. 12, a description will be given of an exposure apparatus 100K as the twelfth embodiment according the present invention. Here, FIG. 12 is a schematic block diagram of a measuring apparatus 200K after the projection optical system 130 of the exposure apparatus 100K. In FIG. 12, the same reference numeral denotes the same element. Therefore, duplicate descriptions will be omitted. The measuring apparatus 200K is different from the measuring apparatus 200J in that the grating 242 is patterned on a back surface of a substrate 240K, the convex lens 220C optical-contacts a surface of the substrate 240K. A little distance between the convex lens 220C and the surface of the substrate 240K exists and the liquid may be filled between the convex lens 220C and the surface of the substrate 240K, and the surface of the substrate 240K may have a curvature and the grating 242 may be patterned on the back surface. These structures can be obtained the same effects. The operation of the measuring apparatus 200K is the same as the measuring apparatus 200J. The NA of the light entered the detector 250 is smaller than the NA of the projection optical system 130 by the numerical aperture decreasing parts 220C and 230. The good interference fringes in the entire surface of the projection optical system are obtained because the NA of the light entered the detector 250 becomes 0.6 or less, and the measuring apparatus 200K can measure with high precision.

Thirteenth Embodiment

Figure 13:
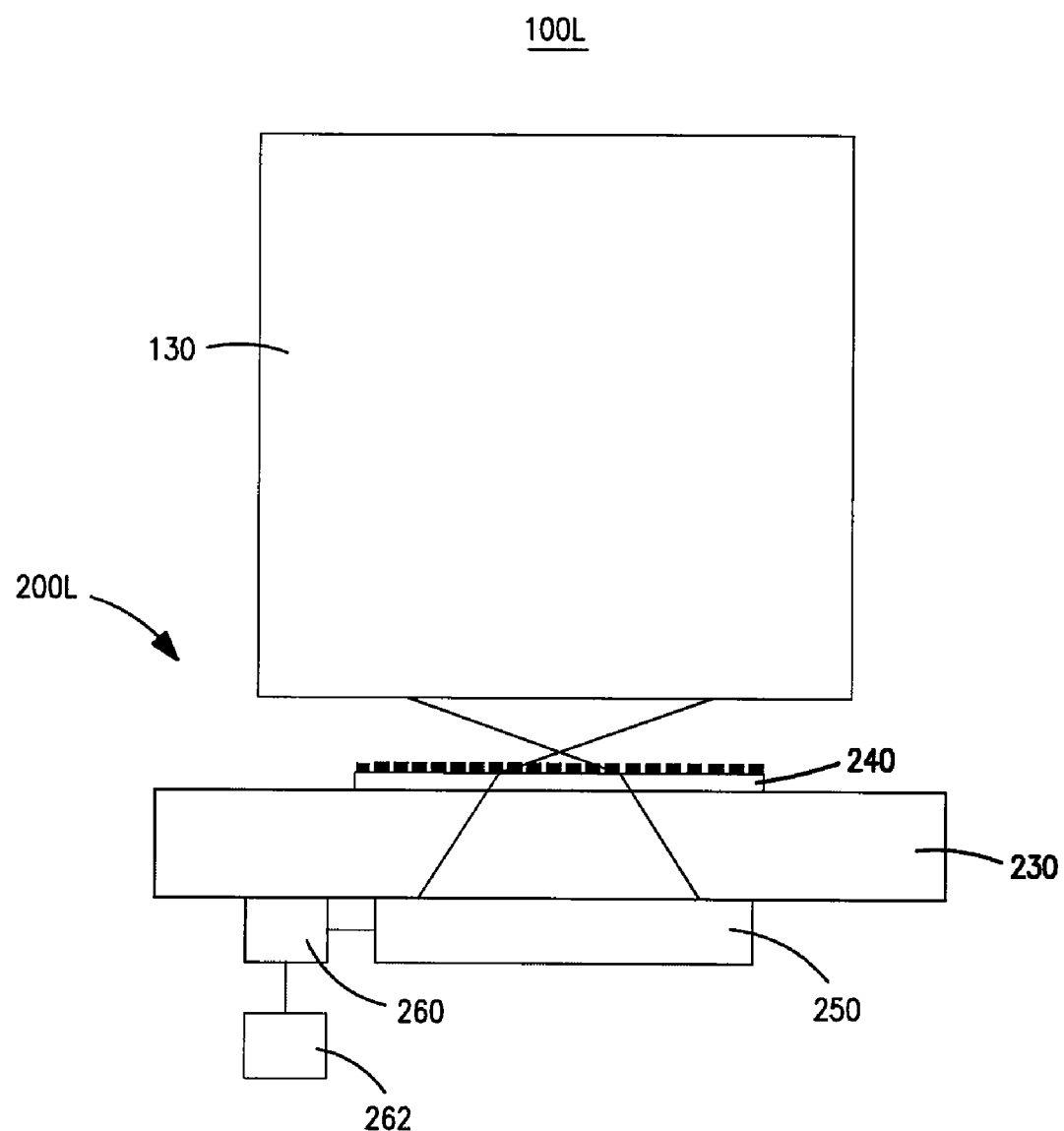
FIG. 13 is a schematic partially block diagram of a measuring apparatus of an exposure apparatus as a thirteenth embodiment according to the present invention.

Referring to FIG. 13, a description will be given of an exposure apparatus 100L as the thirteenth embodiment according the present invention. Here, FIG. 13 is a schematic block diagram of a measuring apparatus 200L after the projection optical system 130 of the exposure apparatus 100L. In FIG. 13, the same reference numeral denotes the same element. Therefore, duplicate descriptions will be omitted. The measuring apparatus 200L is different from the measuring apparatus 200G in that the substrate for interference measurement at the wafer side 240 seals the liquid 230. The grating 242 may be patterned the back surface of the substrate 240. The operation of the measuring apparatus 200L is the same as the measuring apparatus 200G. The NA of the light entered the detector 250 is smaller than the NA of the projection optical system 130 by the numerical aperture decreasing part 230. The good interference fringes in the entire surface of the projection optical system are obtained because the NA of the light entered the detector 250 becomes 0.6 or less, and the measuring apparatus 200L can measure with high precision.

Fourteenth Embodiment

Figure 14:
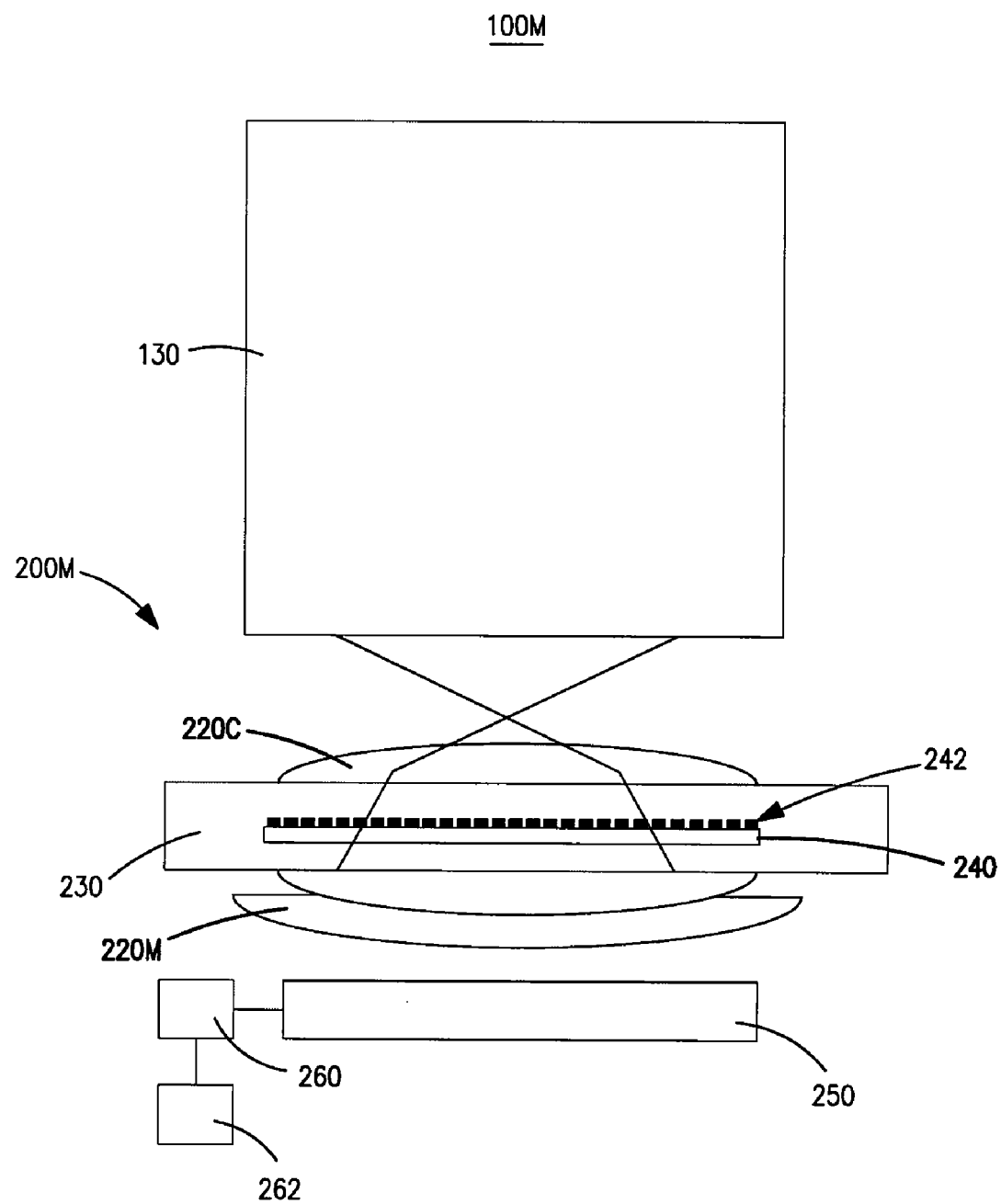
FIG. 14 is a schematic partially block diagram of a measuring apparatus of an exposure apparatus as a fourteenth embodiment according to the present invention.

Referring to FIG. 14, a description will be given of an exposure apparatus 100M as the fourteenth embodiment according the present invention. Here, FIG. 14 is a schematic block diagram of a measuring apparatus 200M after the projection optical system 130 of the exposure apparatus 100M. In FIG. 14, the same reference numeral denotes the same element. Therefore, duplicate descriptions will be omitted. The measuring apparatus 200M is different from the measuring apparatus 200J in that the measuring apparatus 200M has a convex lens 220M at after the back surface of the substrate 240. The operation of the measuring apparatus 200M is the same as the measuring apparatus 200J. The NA of the light entered the detector 250 is smaller than the NA of the projection optical system 130 by the numerical aperture decreasing parts 220C, 220M and 230. The good interference fringes in the entire surface of the projection optical system are obtained because the NA of the light entered the detector 250 becomes 0.6 or less, and the measuring apparatus 200M can measure with high precision.

Fifteenth Embodiment

Figure 15:
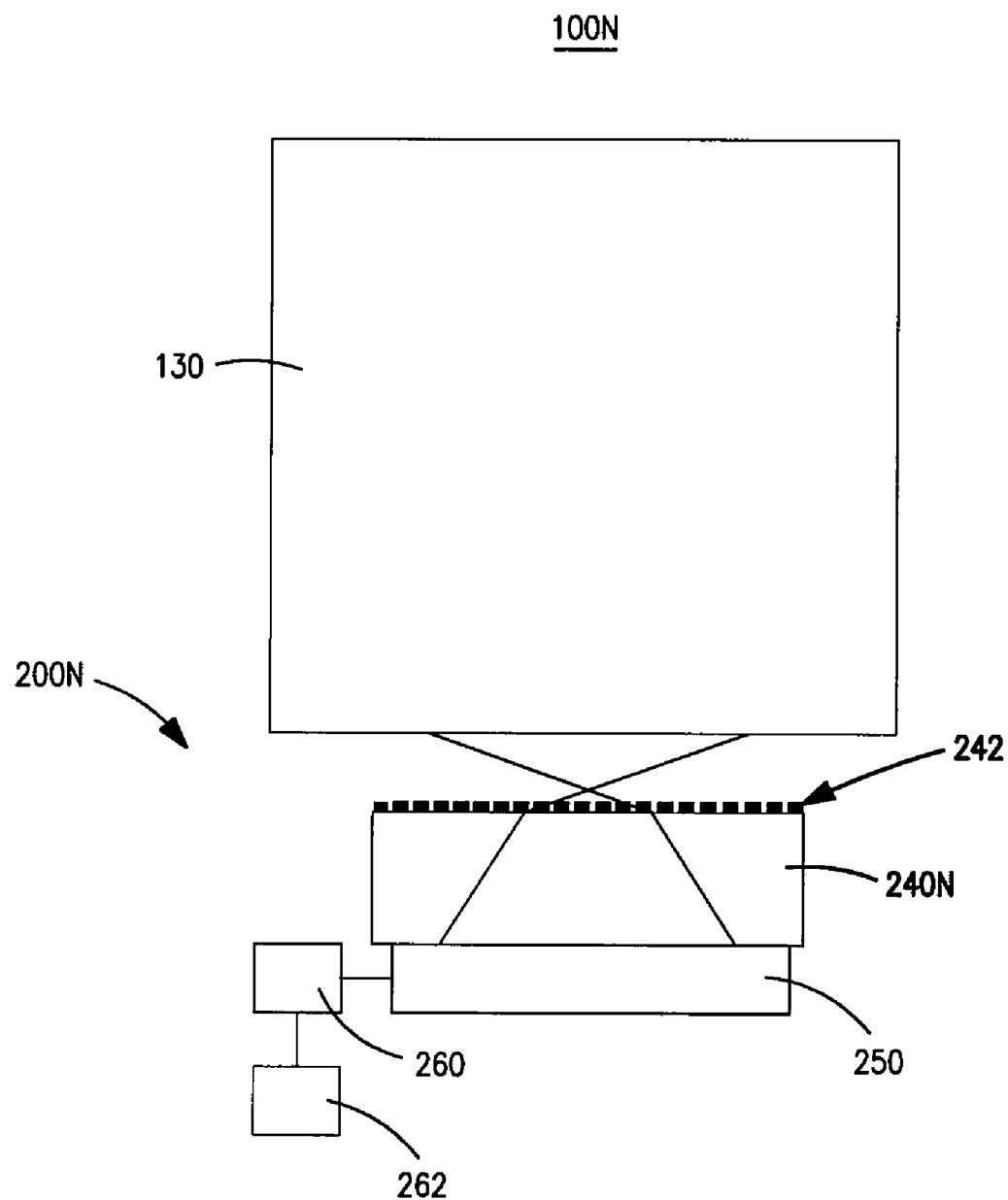
FIG. 15 is a schematic partially block diagram of a measuring apparatus of an exposure apparatus as a fifteenth embodiment according to the present invention.

Referring to FIG. 15, a description will be given of an exposure apparatus 100N as the fifteenth embodiment according the present invention. Here, FIG. 15 is a schematic block diagram of a measuring apparatus 200N after the projection optical system 130 of the exposure apparatus 100N. In FIG. 15, the same reference numeral denotes the same element. Therefore, duplicate descriptions will be omitted. The measuring apparatus 200N is different from the measuring apparatus 200E in that a substrate 240N adheres the detector 250. The operation of the measuring apparatus 200N is the same as the measuring apparatus 200E. In other words, the light penetrated the projection optical system 130 is divided into each order component by the grating 242. The divided light directly enters the detector 250 without penetrating air by adhering the substrate 240N and the detector 250. The NA entered the detector 250 changes according to the refractive index of the substrate 240N, and the instant embodiment sets the NA to 0.25 or more and 0.6 or less. The NA of the light entered the detector 250 is smaller than the NA of the projection optical system 130 by the substrate 240N as the numerical aperture decreasing part. The good interference fringes in the entire surface of the projection optical system are obtained because the NA of the light entered the detector 250 becomes 0.6 or less, and the measuring apparatus 200N can measure with high precision.

Sixteenth Embodiment

Figure 16:
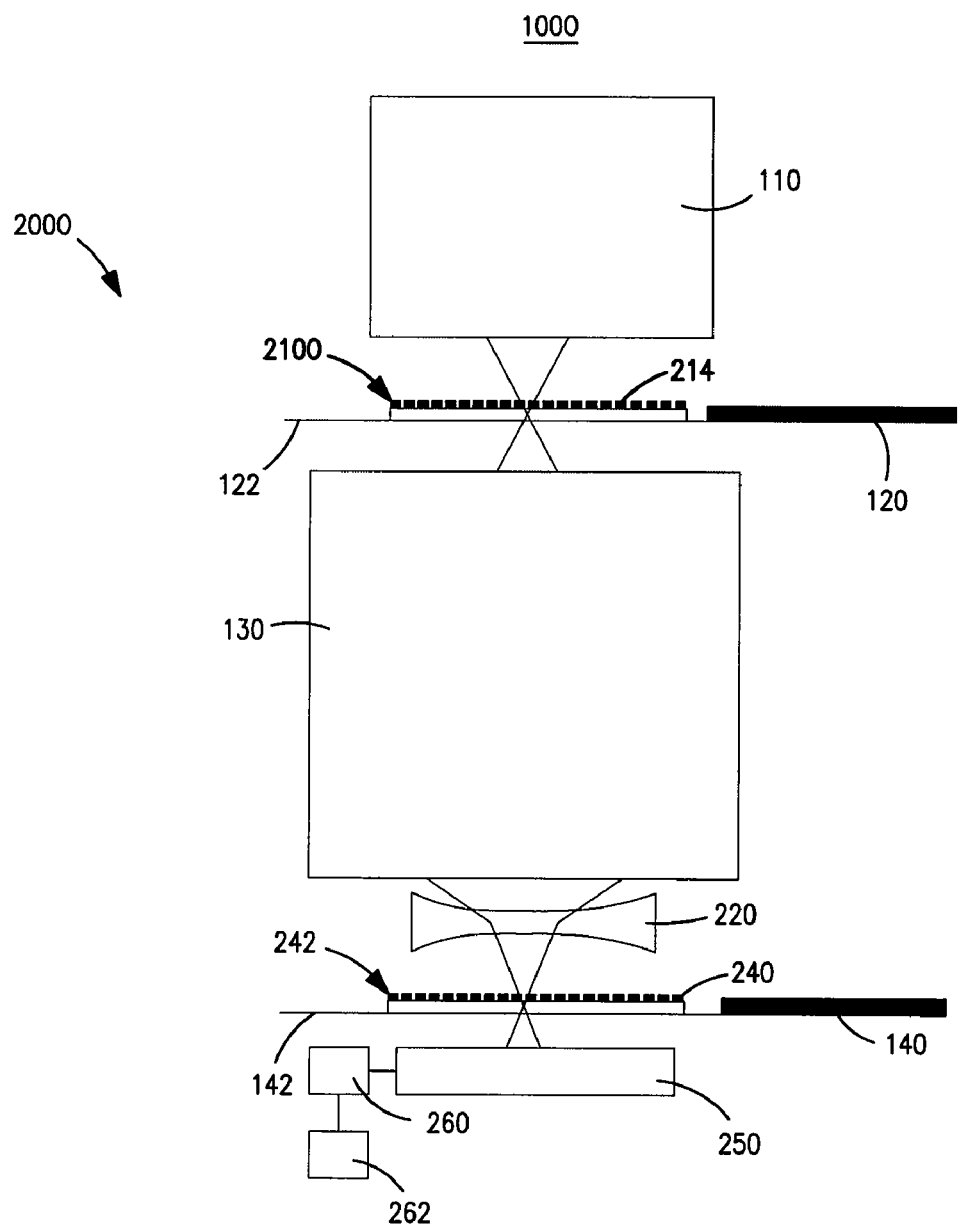
FIG. 16 is a schematic block diagram of an exposure apparatus as a sixteenth embodiment according to the present invention.

Referring to FIG. 16, a description will be given of an exposure apparatus 100O as the sixteenth embodiment according the present invention. Here, FIG. 16 is a schematic block diagram of the exposure apparatus 100O. The exposure apparatus 100O uses a substrate for interference measurement at the reticle side 210O the same structure as the substrate for interference measurement at the wafer side 240, and provides the grating 214 at a position of conjugate. Moreover, the exposure apparatus 100O provides the numerical aperture decreasing part (concave lens) 220 between the projection optical system 130 and the substrate 240 similar to the exposure apparatus 100. The gratings 214 and 242 have the same pitch in consideration of the magnification of the projection optical system 130 and the numerical aperture decreasing part 220.

The light passed through the illumination optical system 110 and divided into each order component by the grating 214 of the substrate 210O penetrates the projection optical system 130, and becomes a light that includes the aberration information of the projection optical system 130. The light included the aberration information is narrowed by the numerical aperture decreasing part 220, and is divided into each order component by the grating 242 of the substrate 240. The detector 250 detects those interference fringes.

Here, the gratings 214 and 242 are provided the position of conjugate, and have the same pitch in consideration of the magnification of the projection optical system 130 and the numerical aperture decreasing part 220. Thereby, the light divided by the substrate 210O is reconstructed by the substrate 240, and interference fringes of a one color without tilt fringe can be obtained.

The measuring apparatus 200O provides the concave lens 220 before the imaging point of the projection optical system 130, and may provide a convex lens 220B after the imaging point.

The NA of the light entered the detector 250 is smaller than the NA of the projection optical system 130 by the numerical aperture decreasing part 220. The good interference fringes in the entire surface of the projection optical system are obtained because the NA of the light entered the detector 250 becomes 0.6 or less, and the exposure apparatus 200O can measure with high precision.

Seventeenth Embodiment

Figure 17:
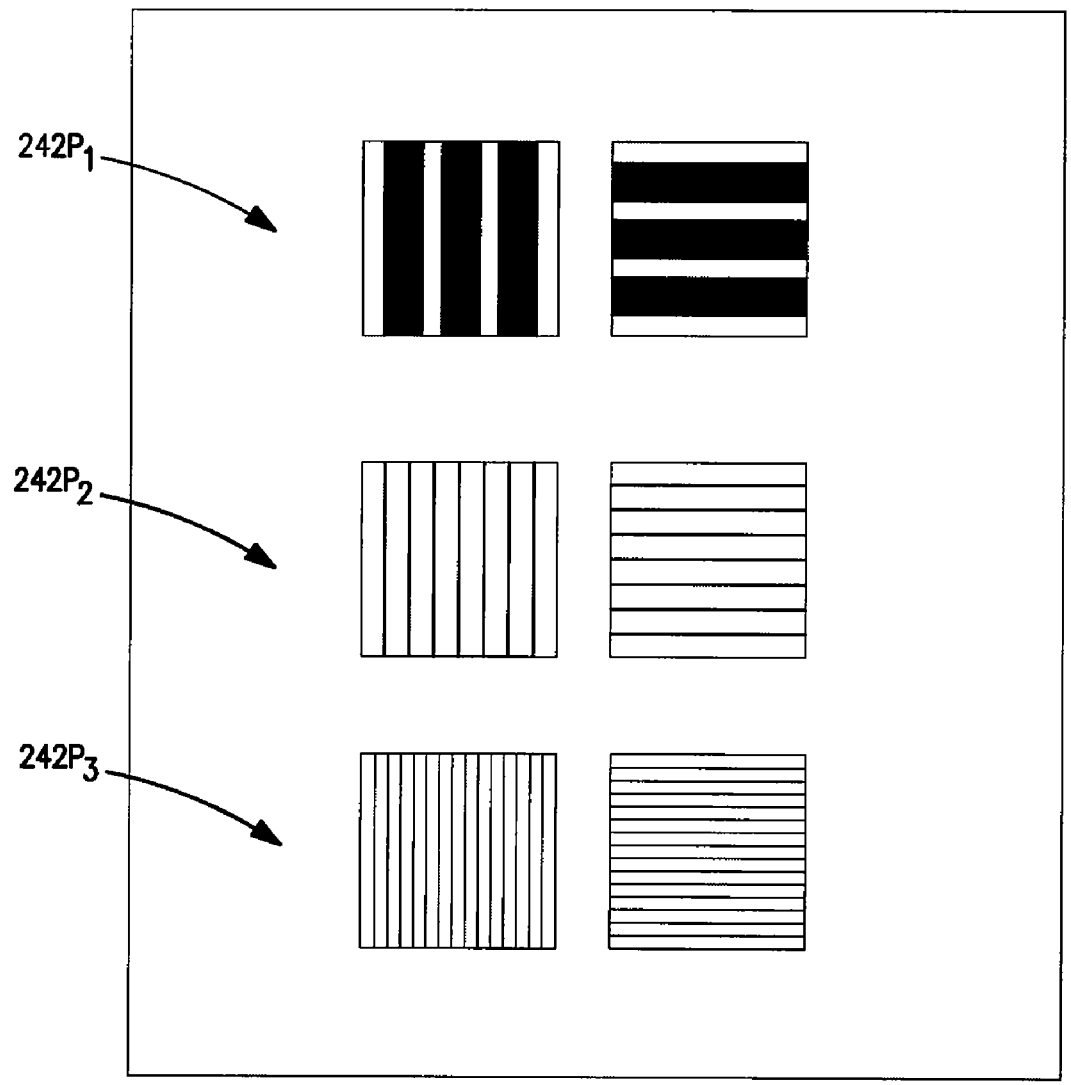
FIG. 17 is a plane view of a substrate for interference measurement at the wafer side used for a measuring apparatus as a seventeenth embodiment according to the present invention.

Referring to FIGS. 17 and 23, a description will be given of the seventeenth embodiment according the present invention. Here, FIG. 17 is a plane view of three kind grating patterns $242P_1$ to $242P_3$ formed on a substrate for interference measurement at the wafer side 16a of the conventional exposure apparatus 10. The instant embodiment can improve the measurement precision even if the conventional exposure apparatus is used.

When the NA is high, the curvature of the wave is large, and measurable interference fringes cannot be obtained in the entire surface of the projection optical system 15. For example, when the interference fringes of the center part can be measured, the interference fringes of circumference become dense and cannot be measured. The measuring apparatus selects a pattern for the NA, measures the measurable area by each pattern, and obtains the optical property of the entire projection optical system 15 by uniting these results.

The optical path difference is small until the NA of 0.6 as shown in FIG. 23. Thereby, the measuring apparatus measures waves that have the NA of 0.6 or less using one pattern, and measures waves that have the NA of more than 0.6 using one or more pattern according the tilt of the wave. Then, the entire wave is formed by uniting those waves.

Concretely, in the measuring apparatus, the pattern $242P_1$ calculates the waves that have the NA of 0.6 or less, the pattern $242P_2$ calculates the waves that have the NA of 0.5 to 0.75, and the pattern $242P_3$ calculates the waves that have the NA of 0.65 to 0.85. Then, the wave that has the NA of 0.85 is obtained by uniting them. Thereby, the measuring apparatus uses a finer pitch pattern as the higher NA.

Eighteenth Embodiment

Figure 18:
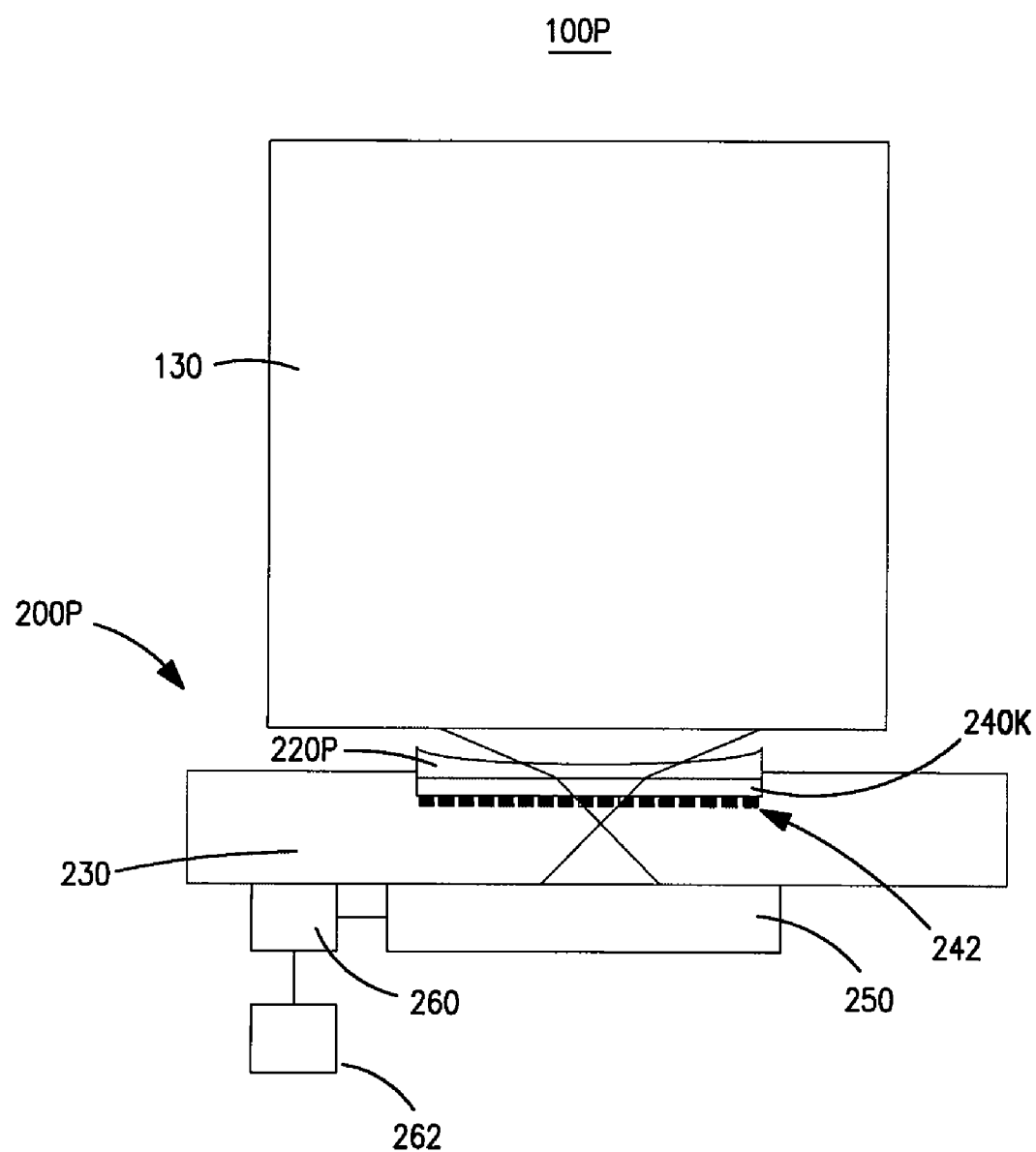
FIG. 18 is a schematic partially block diagram of a measuring apparatus of an exposure apparatus as an eighteenth embodiment according to the present invention.

Referring to FIG. 18, a description will be given of an exposure apparatus 100P as the eighteenth embodiment according the present invention. Here, FIG. 18 is a schematic block diagram of a measuring apparatus 200P after the projection optical system 130 of the exposure apparatus 100P. In FIG. 18, the same reference numeral denotes the same element. Therefore, duplicate descriptions will be omitted. The measuring apparatus 200P is different form the measuring apparatus 200K in that a plane concave lens 220P optical-contacts the substrate 240K. A little distance between the plane concave lens 220P and the surface of the substrate 240K exists and the liquid may be filled between the plane concave lens 220P and the surface of the substrate 240K, and the surface of the substrate 240K may have a curvature and the grating 242 may be patterned on the back surface. These structures can be obtained the same effects. The operation of the measuring apparatus 200P is the same as the measuring apparatus 200K. The NA of the light entered the detector 250 is smaller than the NA of the projection optical system 130 by the numerical aperture decreasing parts 220P and 230. The good interference fringes in the entire surface of the projection optical system are obtained because the NA of the light entered the detector 250 becomes 0.6 or less, and the measuring apparatus 200P can measure with high precision.

Nineteenth Embodiment

Figure 19:
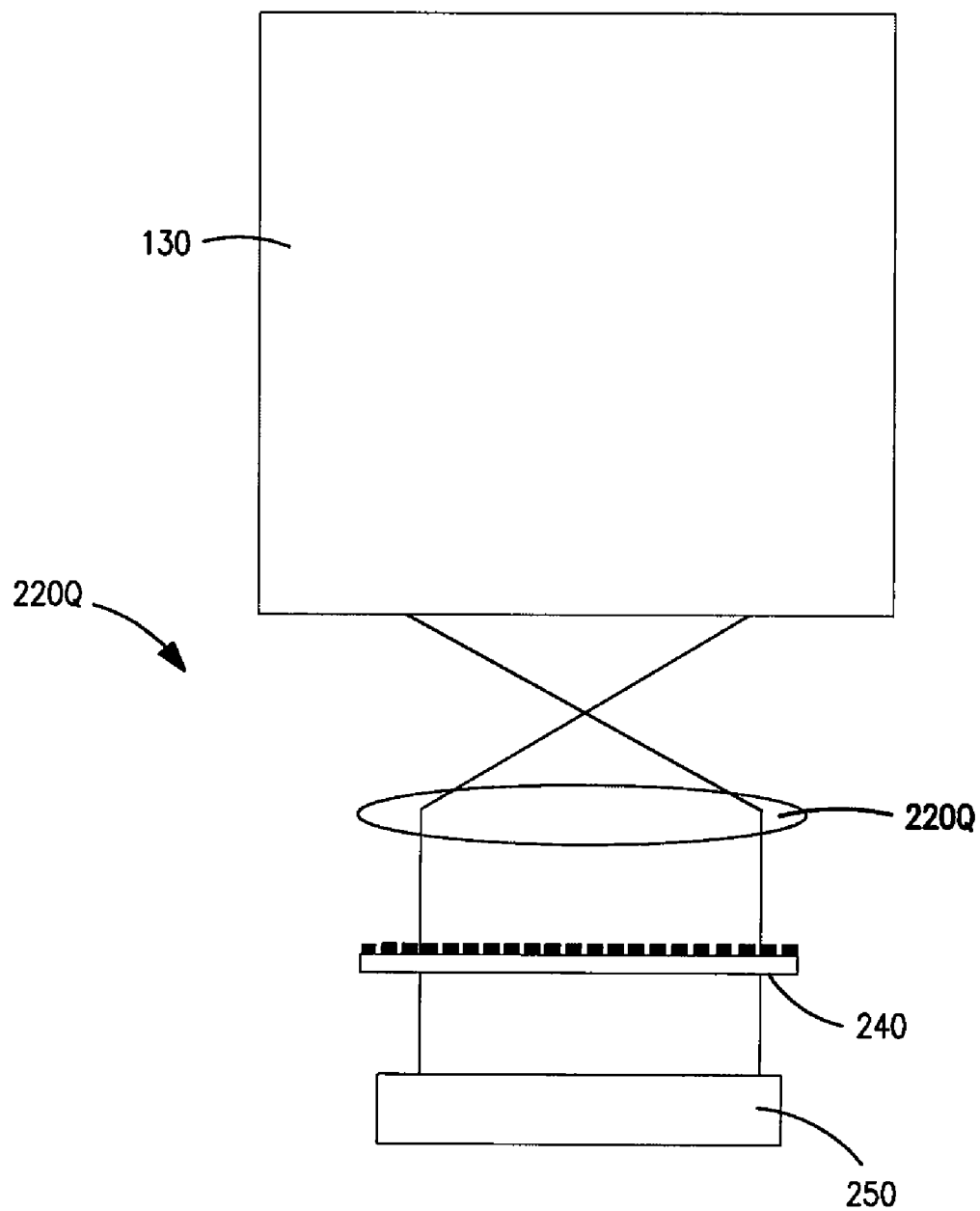
FIG. 19 is a schematic partially block diagram of a measuring apparatus of an exposure apparatus as a nineteenth embodiment according to the present invention.

Referring to FIG. 19, a description will be given of an exposure apparatus 100Q as the eighteenth embodiment according the present invention. Here, FIG. 19 is a schematic block diagram of a measuring apparatus 200Q after the projection optical system 130 of the exposure apparatus 100Q. In FIG. 19, the same reference numeral denotes the same element. Therefore, duplicate descriptions will be omitted. The measuring apparatus 200Q is different from the measuring apparatus 200B in that the measuring apparatus 200Q has a collimator lens 220Q as the numerical aperture decreasing part. Therefore, the present invention does not except that the numerical aperture decreasing part decreases the NA to 0.25 or less (for example, NA=0). The NA of the light entered the detector 250 is smaller than the NA of the projection optical system 130 by the numerical aperture decreasing part 220Q. The good interference fringes in the entire surface of the projection optical system are obtained because the NA of the light entered the detector 250 becomes 0.6 or less, and the measuring apparatus 200P can measure with high precision.

Hereafter, a description will be given of an aberration correction method according to one embodiment of the present invention. The exposure apparatuses 100 to 100Q allow plural optical elements (not shown) in the projection optical system 130 to move in the optical axis direction and/or a direction orthogonal to the optical axis direction. By driving one or more optical elements using a driving system (not shown) for aberration adjustments based on aberrational information obtained from the instant embodiment, it is possible to correct or optimize one or more aberrations of the projection optical system 130, in particular Zeidel's classification of aberrations. The means for adjusting the aberration of the projection optical system 130 can use various known systems, such as a movable lens, a movable mirror (when the projection optical system is a catadioptric optical system or full-mirror optical system), an inclinable parallel plate, a pressure-controllable space, and a surface correction using actuator.

In the normal exposure, the light exited from the light source section enters the illumination optical system 110. The light entered the illumination optical system 110 Koehler-illuminates, for example, the reticle 120. The reticle 120 is mounted on the reticle stage 122, and driven during exposure in the scanner. The light that passes the reticle 120 and reflects the reticle pattern is imaged onto the plate 140 fixed onto the wafer stage 142 via the wafer chuck (not shown) by the projection optical system 130 at a projection magnification (for example, ¼ and ⅕). The wafer chuck is provided on the wafer stage 142, and driven during the exposure. Since the aberration of the projection optical system 130 is corrected, the plate 140 can receive the high-quality exposure process (or the predetermined resolution).

Figure 20:
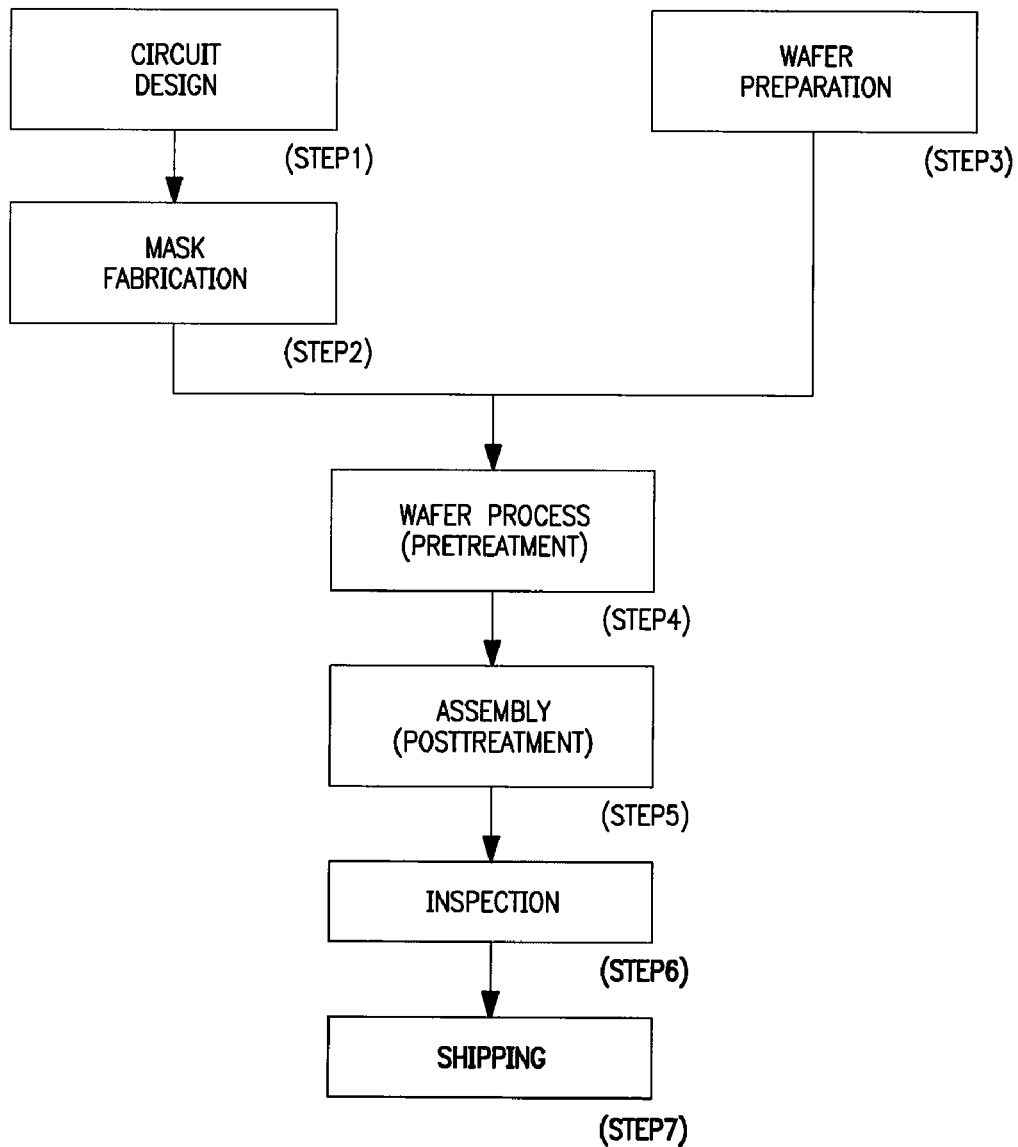
FIG. 20 is a flowchart for explaining how to fabricate devices (such as semiconductor chips such as ICs, LCDs, CCDs, and the like)
Figure 21:
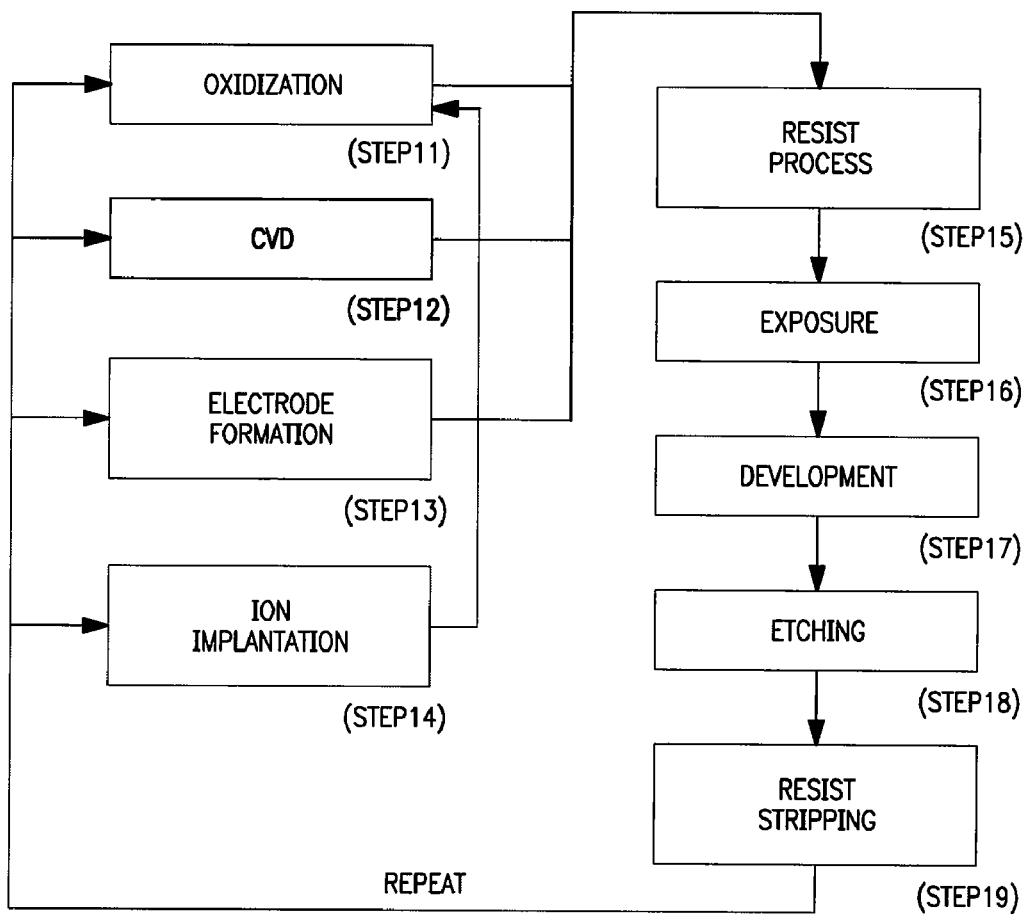
FIG. 21 is a detail flowchart of a wafer process in Step 4 of FIG. 20.

Referring now to FIGS. 20 and 21, a description will be given of an embodiment of a device fabrication method using the above mentioned exposure apparatus 100 etc. FIG. 20 is a flowchart for explaining how to fabricate devices (i.e., semiconductor chips such as IC and LSI, LCDs, CCDS, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 21 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The fabrication method of the instant embodiment can quickly and easily obtain the imaging performance of the projection optical system 130 whose wave front aberration has been highly precisely corrected can provide an alignment for the wafer stage with high precision. Therefore, the manufacture semiconductor devices with good productivity and economical efficiency (such as semiconductor devices, LCD device, image pickup device (e.g., CCDs), and thin film magnetic heads) which have been difficult to manufacture. Thus, the device fabrication method using the exposure apparatus 100, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Applications No. 2005-040271, filed on Feb. 17, 2005, which is hereby incorporated by reference herein in its entirety as if fully set forth herein.

What is claimed is:

1. A measuring apparatus for measuring an optical performance of an optical system to be measured that has a numerical aperture of more than 0.6 at a light exit side, said measuring apparatus comprising:
a substrate for interference measurement that includes a first pattern that has a first pitch, and a second pattern that has a second pitch, the first pitch being used for the numerical aperture of 0.6 or less of a light exited from the optical system, the second pitch being used for the numerical aperture of more than 0.6 of the light exited from the optical system and being narrower than the first pitch; and a detector for detecting interference fringes formed by the light, wherein said measuring apparatus combines results of plural measurements using the first pattern and the second pattern.

2. An exposure apparatus for exposing a pattern of a reticle onto an object via a projection optical system using a light from the light source, said exposure apparatus comprising a measuring apparatus for detecting an optical performance of the projection optical system using the light as interference fringes, wherein said projection optical system has a numerical aperture of more than 0.6 at an object side, and wherein said measuring apparatus is a measuring apparatus according to claim 1.

3. A device fabrication method comprising the steps of:

exposing an object using an exposure apparatus according to claim 2; and performing a development process for the object exposed.

4. A measuring apparatus to claim 1, wherein the first pattern and the second pattern include:

a pattern used for the numerical aperture of 0.6 or less of the light exited from the optical system, a pattern used for the numerical aperture from 0.5 to 0.75 of the light exited from the optical system, and a pattern used for the numerical aperture from 0.65 to 0.85 of the light exited from the optical system.

* * * * *